United States Patent [19]
Ono et al.

[11] Patent Number: 5,589,778
[45] Date of Patent: Dec. 31, 1996

[54] SENSOR DRIVE CIRCUIT

[75] Inventors: Yukio Ono; Seiichiro Kikuyama, both of Hyogo, Japan

[73] Assignee: Mitsubishi Denki Kabushiki Kaisha, Tokyo, Japan

[21] Appl. No.: 419,697

[22] Filed: Apr. 11, 1995

[30] Foreign Application Priority Data

May 20, 1994 [JP] Japan ................................. 6-106597

[51] Int. Cl.⁶ .................................................. G01R 27/28
[52] U.S. Cl. ........................................... 324/654; 324/656
[58] Field of Search ................................. 324/656, 655, 324/654, 207.16, 207.15, 207.14, 207.5

[56] References Cited

U.S. PATENT DOCUMENTS

| | | | |
|---|---|---|---|
| 4,258,315 | 3/1981 | Westra | 324/656 |
| 5,202,628 | 4/1993 | Locher et al. | 324/207.16 |
| 5,332,966 | 7/1994 | Berberich | 324/656 |

FOREIGN PATENT DOCUMENTS

| | | | |
|---|---|---|---|
| 4142680 | 7/1993 | Germany | 324/654 |
| 0217784 | 2/1979 | Japan | 324/656 |
| 2097941 | 11/1982 | United Kingdom | 324/656 |

*Primary Examiner*—Louis M. Arana
*Attorney, Agent, or Firm*—Oblon, Spivak, McClelland, Maier & Neustadt, P.C.

[57] ABSTRACT

A sensor drive circuit which accurately detects the amount of variation in inductance of a coil serving as a variable sensor. A peak detector circuit detects a peak value of a difference signal between a variable-amplitude signal and an intermediate signal to output a peak detection signal as a verification signal to a first input of an error amplifier. The error amplifier has a second input receiving a reference voltage and outputs a control signal to an AGC circuit on the basis of the result of comparison between the peak detection signal and the reference voltage. A peak detector circuit detects a peak value of a difference signal between the variable-amplitude signal and an inverted variable-amplitude signal to output the peak value as an inductance detection signal to the exterior. The AGC circuit performs automatic gain adjustment to output a signal of determined amplitude to a buffer in response to the control signal from the error amplifier.

24 Claims, 24 Drawing Sheets

SINE WAVE → RECTANGULAR WAVE

SENSOR DRIVE CIRCUIT

BACKGROUND OF THE INVENTION

1. Field of the Invention

The present invention relates to a sensor drive circuit for diving a sensor using the amount of variation in inductance of a coil as a sense signal.

2. Description of the Background Art

Position information of an automotive fuel pump and the like are sensed by the amount of variation in inductance of a coil. FIG. 23 is a sectional view illustrating this concept. Referring to FIG. 23, an annular coil 52 surrounds a middle portion 51A of an E-shaped iron core 51, and a copper plate movable piece 53 is disposed in the middle portion 51A. The movable piece 53 moves in rightward and leftward directions of FIG. 23 in accordance with the position indicative of the remaining quantity in the fuel pump, for example. As the movable piece 53 moves, a magnetic flux 54 developed in the iron core 51 is interrupted with varying degrees, varying the inductance of the coil 52. For instance, the inductance of the coil 52 increases as the movable piece 53 moves rightwardly in FIG. 23, and decreases as the movable piece 53 moves leftwardly.

A sensor drive circuit drives a sensor including a coil making a sensor action by using the amount of variation in inductance of the coil on the above described principle.

FIG. 24 is a block diagram illustrating the internal construction of a conventional sensor drive circuit using a coil as a sensor. Referring to FIG. 24, an oscillator circuit 1 outputs a sine-wave oscillating signal to an AGC (automatic gain control) circuit 2. The AGC circuit 2 performs automatic gain adjustment to provide an output signal of determined amplitude to a buffer 3 in response to a control signal S9 from an error amplifier 9.

An output from the buffer 3 is applied to a first end of a reference sensor 5 including a fixed coil, to first inputs of full-wave rectifier circuits 7 and 10, and to an input of an inverter 4. An output from the inverter 4 is applied to a first end of a variable sensor 6 including a variable coil and to a second input of the full-wave rectifier circuit 10.

A second end of the reference sensor 5 and a second end of the variable sensor 6 are connected at a node N1 which in turn is connected to a second input of the full-wave rectifier circuit 7.

The full-wave rectifier circuit 7 full-wave rectifies a difference signal between the signals given at the first and second inputs to output the rectified difference signal to an integration circuit 8. The integration circuit 8 integrates the output from the full-wave rectifier circuit 7 to output the integrated signal to a first input of the error amplifier 9.

The error amplifier 9 receives a reference voltage VR at its second input and outputs the control signal S9 to the AGC circuit 2 on the basis of the result of comparison between the output from the integration circuit 8 and the reference voltage VR.

The full-wave rectifier circuit 10 full-wave rectifies a difference signal between the signals given at the first and second inputs to output the rectified difference signal to an integration circuit 11. The integration circuit 11 integrates the output from the full-wave rectifier circuit 10 to output an inductance detection signal OUT to the exterior.

In such a construction, the sine-wave oscillating signal from the oscillator circuit 1 is amplified by the AGC circuit 2 and is then applied to the buffer 3. The output from the buffer 3 is applied to the first end of the reference sensor 5, and to the first end of the variable sensor 6 through the inverter 4.

Then the signals at the first and second ends of the reference sensor 5 are impressed upon the first and second inputs of the full-wave rectifier circuit 7, respectively. The signals at the first ends of the reference sensor 5 and variable sensor 6 are impressed upon the first and second inputs of the full-wave rectifier circuit 10, respectively.

The difference signal between the signals at the first and second ends of the reference sensor 5 is full-wave rectified by the full-wave rectifier circuit 7, smoothed by the integration circuit 8, and then applied to the first input of the error amplifier 9. At this time, the reference voltage VR applied to the second input of the amplifier 9 is previously set to a voltage level of a signal which, if the difference signal between the signals at the first and second ends of the reference sensor 5 is an expected sine-wave signal, is provided by full-wave rectifying and integrating the sine-wave signal.

Thus, when the output from the integration circuit 8 is lower than the reference voltage VR, the error amplifier 9 outputs to the AGC circuit 2 the control signal S9 which directs the AGC circuit 2 to increase the amplitude, and the AGC circuit 2 is controlled so that the amplitude of the output signal increases. On the other hand, when the output from the integration circuit 8 is higher than the reference voltage VR, the error amplifier 9 outputs to the AGC circuit 2 the control signal S9 which directs the AGC circuit 2 to decrease the amplitude, and the AGC circuit 2 is controlled so that the amplitude of the output signal decreases.

In this manner, the control signal S9 from the error amplifier 9 controls the output signal from the AGC circuit 2 such that the output from the integration circuit 8 becomes equal to the reference voltage VR. This permits the reference sensor 5 to provide the constant signals at the first and second ends.

The difference signal between the signals at the first ends of the reference sensor 5 and variable sensor 6 is full-wave rectified by the full-wave rectifier circuit 10 and smoothed by the integration circuit 11, and the inductance detection signal OUT is outputted to the exterior.

At this time, the amplitude (A5) of the difference signal between the signals at the first and second ends of the reference sensor 5 is controlled to be held constant by the AGC circuit 2. Thus, the relation between the amplitude (A5) and the amplitude (A56) of the difference signal between the signals at the respective first ends of the reference sensor 5 and variable sensor 6 is represented by the relational expression using the inductance L0 of the reference sensor 5 and the inductance L1 of the variable sensor 6.

$$\begin{aligned} A56 &= \{(L0+L1)/L0\} \cdot A5 \\ &= (1+L1/L0) \cdot A5 \end{aligned}$$

That is, the reference amplitude A5 plus (L1/L0)·A5 equals the amplitude A56. Therefore, verification of the voltage of the inductance detection signal OUT allows detection of the amount of variation in inductance L1 by the inverse operation.

FIG. 25 illustrates the operation of the full-wave rectifier circuit 7 (10) and the integration circuit 8 (11). Upon receipt of a difference signal SS1, the full-wave rectifier circuit 7 rectifies the difference signal SS1 to a signal SS2 which in turn is smoothed by the integration circuit 8 into a signal SS3. When the waveform of the difference signal SS1 is expressed by A sin θ+v1, the waveform of the smoothed signal SS3 is expressed as (2A/π)+v1.

Accordingly, the reference voltage VR is set to (2A'/π)+ (v1)' when the ideal waveform of the difference signal SS1 is expressed by A' sinθ+(v1)'.

In the conventional sensor drive circuit as above constructed, the amplitude of the output signal from the AGC circuit 2 has been controlled on the basis of the result of comparison between the reference voltage VR and the voltage level provided by full-wave rectifying and smoothing the amplitude of the difference signal between the signals at the first and second ends of the reference sensor 5.

Thus, the verification voltage applied to the error amplifier 9 is a voltage compressed to 2/π times the amplitude of the difference signal impressed upon the full-wave rectifier circuit 7, resulting in less accurate control by the AGC circuit 2.

The result is inaccurate constant amplitude control of the signals at the first and second ends of the reference sensor 5, causing the problem of less accurate verification of the inductance L1 of the variable sensor 6.

Further, the voltage level of the inductance detection signal OUT from the integration circuit 11 is also compressed to 2/π times the amplitude of the difference signal impressed upon the full-wave rectifier circuit 10. From this viewpoint, the problem arises that the amount of variation in inductance L1 of the variable sensor 6 is detected with lower accuracy in response to the inductance detection signal OUT.

SUMMARY OF THE INVENTION

According to the present invention, a sensor drive circuit comprises: a reference sensor having first and second ends and including a first coil of a fixed inductance; a variable sensor including a second coil of a variable inductance, the second coil being connected in series with the first coil; amplitude control means receiving a first signal from a side of the first end of the reference sensor and a second signal from a side of the second end thereof for controlling an amplitude of a difference signal between the first and second signals so as to be held constant; and inductance detection signal output means for outputting an inductance detection signal responsive to the amount of variation in the inductance of the second coil of the variable sensor, the amplitude control means including: peak detecting means receiving the first and second signals for detecting a peak value of the difference signal to output a peak detection signal; and signal applying means receiving the peak detection signal for applying a signal to the first and second coils so that amplitudes of the first and second signals are varied in response to the peak detection signal.

As above described, the sensor drive circuit of the present invention comprises the peak detecting means receiving the first and second signals for detecting the peak value of the difference signal to output the peak detection signal, and the signal applying means receiving the peak detection signal for applying the signal to the first and second coils so that the amplitudes of the first and second signals are varied in response to the peak detection signal.

Since the peak detection signal is provided without compressing the amplitude of the difference signal, the signal applying means varies the amplitudes of the first and second signals in response to the peak detection signal, thereby accurately controlling the amplitudes of the signals applied to the first and second ends of the reference sensor.

The result is high-accuracy constant amplitude control of the difference signal between the first and second signals provided at the first and second ends of the reference sensor, permitting the inductance of the second coil of the variable sensor to be detected accurately in response to the inductance detection signal.

Preferably, the inductance detection signal output means includes second peak detecting means receiving a third signal provided at a first end of the variable sensor and a fourth signal provided at a second end thereof for detecting a peak value of a difference signal between the third and fourth signals to output the peak value as the inductance detection signal.

Since the inductance detection signal output means for the sensor drive circuit of the present invention includes the second peak detecting means, the inductance detection signal itself is also provided without compressing the amplitude of the difference signal between the third and fourth signals.

Consequently, increased accuracy of the inductance detection signal itself allows further increased detection accuracy of the amount of variation in inductance of the second coil of the variable sensor in response to the inductance detection signal.

Preferably, the peak detecting means includes: subtraction means for performing subtraction of the first and second signals to output the difference signal; peak hold means for detecting the peak value of the difference signal and holding the value to output a peak signal; and sampling means for sampling the peak signal during a predetermined sampling time period to output the peak detection signal, and the sensor drive circuit further comprises: reset signal generating means receiving a reset time period control signal for varying an activation tinting to output a reset signal in response to a cycle of the reset time period control signal; and reset executing means for setting the peak value of the difference signal held by the peak hold means to a predetermined initial level when the reset signal is active.

Variations in the cycle of the reset time period control signal allow variable control of the peak detection and hold time periods of the peak hold means.

Preferably, the peak detecting means detects a positive peak value and a negative peak value of the difference signal, and the peak detection signal is a difference between the positive peak value and the negative peak value.

The peak detection signal is provided without compressing the amplitude of the difference signal in the positive and negative directions. Thus, variations in the amplitudes of the first and second signals in response to the peak detection signal allow accurate control of the amplitudes of the signals provided at the first and second ends of the reference sensor.

The result is high-accuracy constant amplitude control of the difference signal between the first and second signals provided at the first and second ends of the reference sensor, permitting the inductance of the second coil of the variable sensor to be detected more accurately in response to the inductance detection signal. It is therefore an object of the present invention to provide a sensor drive circuit which detects the amount of variation in inductance of a coil serving as a variable sensor with high accuracy.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
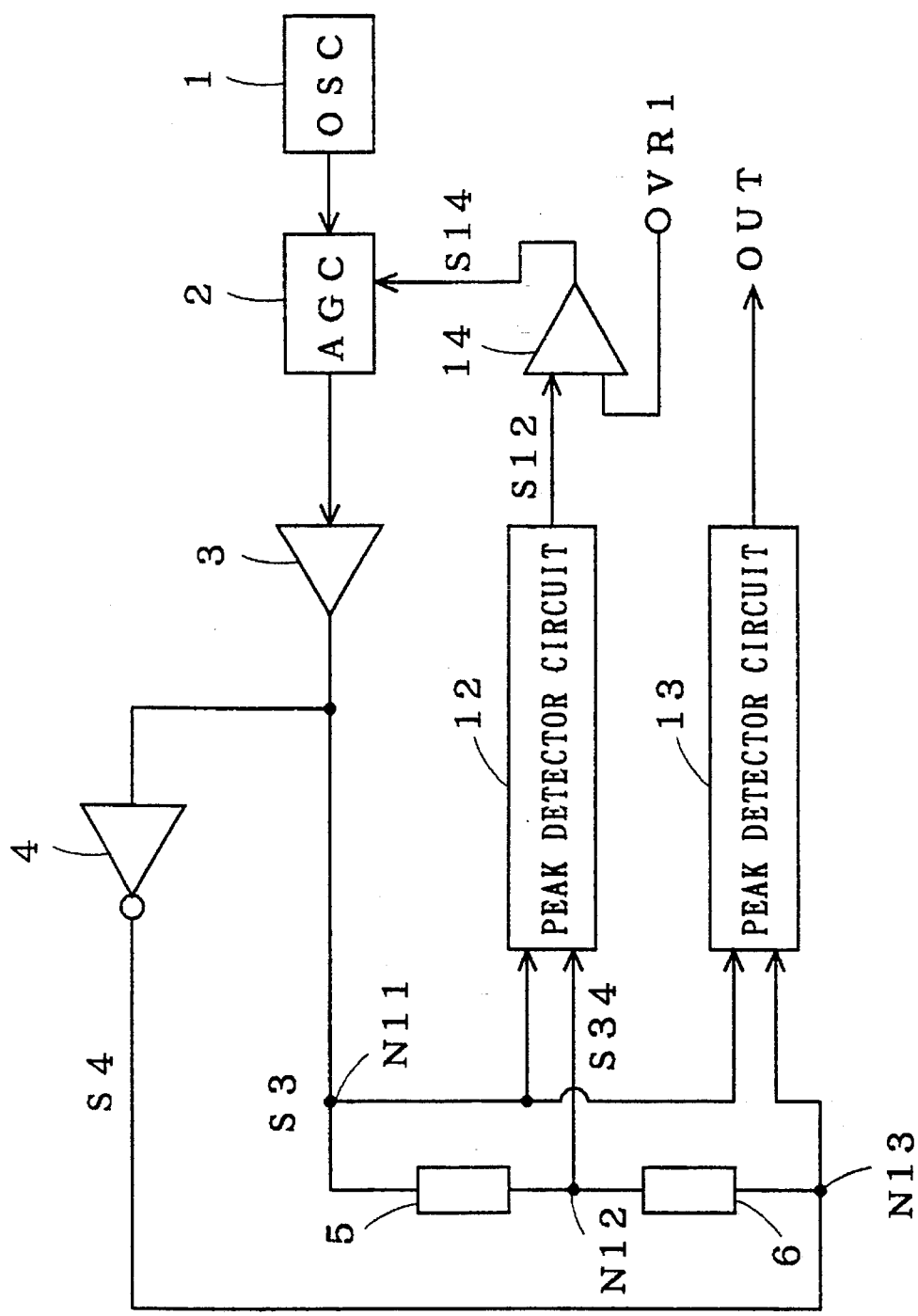
FIG. 1 is a block diagram of a sensor drive circuit according to a first preferred embodiment of the present invention.

FIG. 1 is a block diagram of a sensor drive circuit according to a first preferred embodiment of the present invention. Referring to FIG. 1, an oscillator circuit 1 outputs a sine-wave oscillating signal to an AGC circuit 2. The AGC circuit 2 performs automatic gain adjustment to provide an output signal of determined amplitude to a buffer 3 in response to a control signal S14 from an error amplifier 14.

A variable-amplitude signal S3 from the buffer 3 is applied to a node N11 at a first end of a reference sensor 5 including a fixed coil and to an inverter 4 which in turn outputs an inverted variable-amplitude signal S4 to a node N13 at a first end of a variable sensor 6.

Second ends of the reference sensor 5 and variable sensor 6 are connected commonly at a node N12 at which is provided an intermediate signal S34. The variable-amplitude signal S3 and the intermediate signal S34 are applied respectively to first and second inputs of a peak detector circuit 12. The variable-amplitude signal S3 and the inverted variable-amplitude signal S4 are applied respectively to first and second inputs of a peak detector circuit 13.

The peak detector circuit 12 detects a peak value of a difference signal between the variable-amplitude signal S3 and the intermediate signal S34 to output a peak detection signal S12 as a verification signal to a first input of the error amplifier 14. The error amplifier 14 receives a reference voltage VR1 at its second input and outputs the control signal S14 to the AGC circuit 2 on the basis of the result of comparison between the peak detection signal S12 and the reference voltage VR1.

The peak detector circuit 13 detects a peak value of a difference signal between the variable-amplitude signal S3 and the inverted variable-amplitude signal S4 to output the peak value as an inductance detection signal OUT to the exterior.

Figure 2:
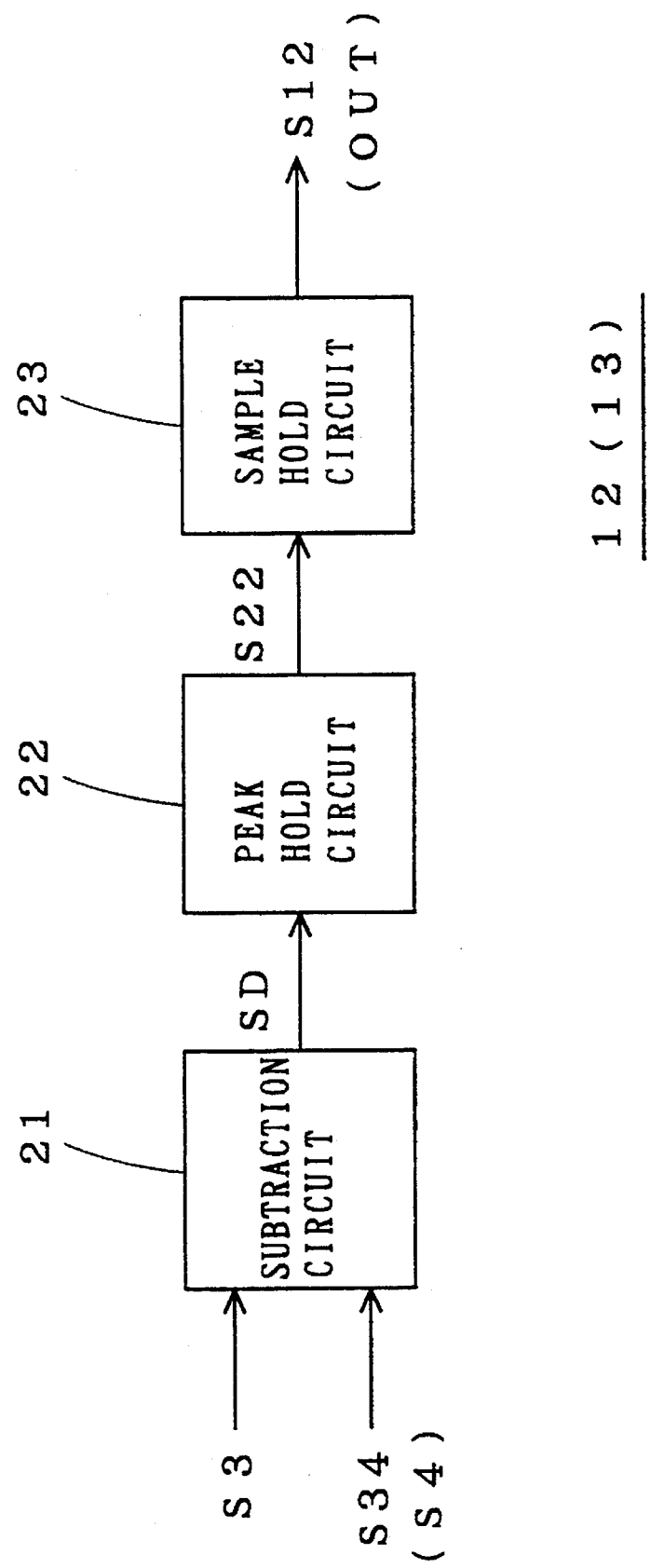
FIG. 2 is a block diagram illustrating the internal construction of a peak detector circuit of FIG. 1.

FIG. 2 is a block diagram illustrating the internal construction of the peak detector circuit 12 (13). As shown in FIG. 2, the peak detector circuit 12 comprises a subtraction circuit 21, a peak hold circuit 22 and a sample hold circuit 23.

The subtraction circuit 21 receives the variable-amplitude signal S3 and the intermediate signal S34 (the inverted variable-amplitude signal S4 in the peak detector circuit 13) and performs subtraction of the variable-amplitude signal S3 and the intermediate signal S34 to output a difference signal SD to the peak hold circuit 22.

The peak hold circuit 22 detects a positive peak value of the difference signal SD and holds the value to output a peak signal S22.

The sample hold circuit 23 samples the peak signal S22 for a predetermined sampling time period to output the peak detection signal S12 (the inductance detection signal OUT in the peak detector circuit 13).

Figure 3:
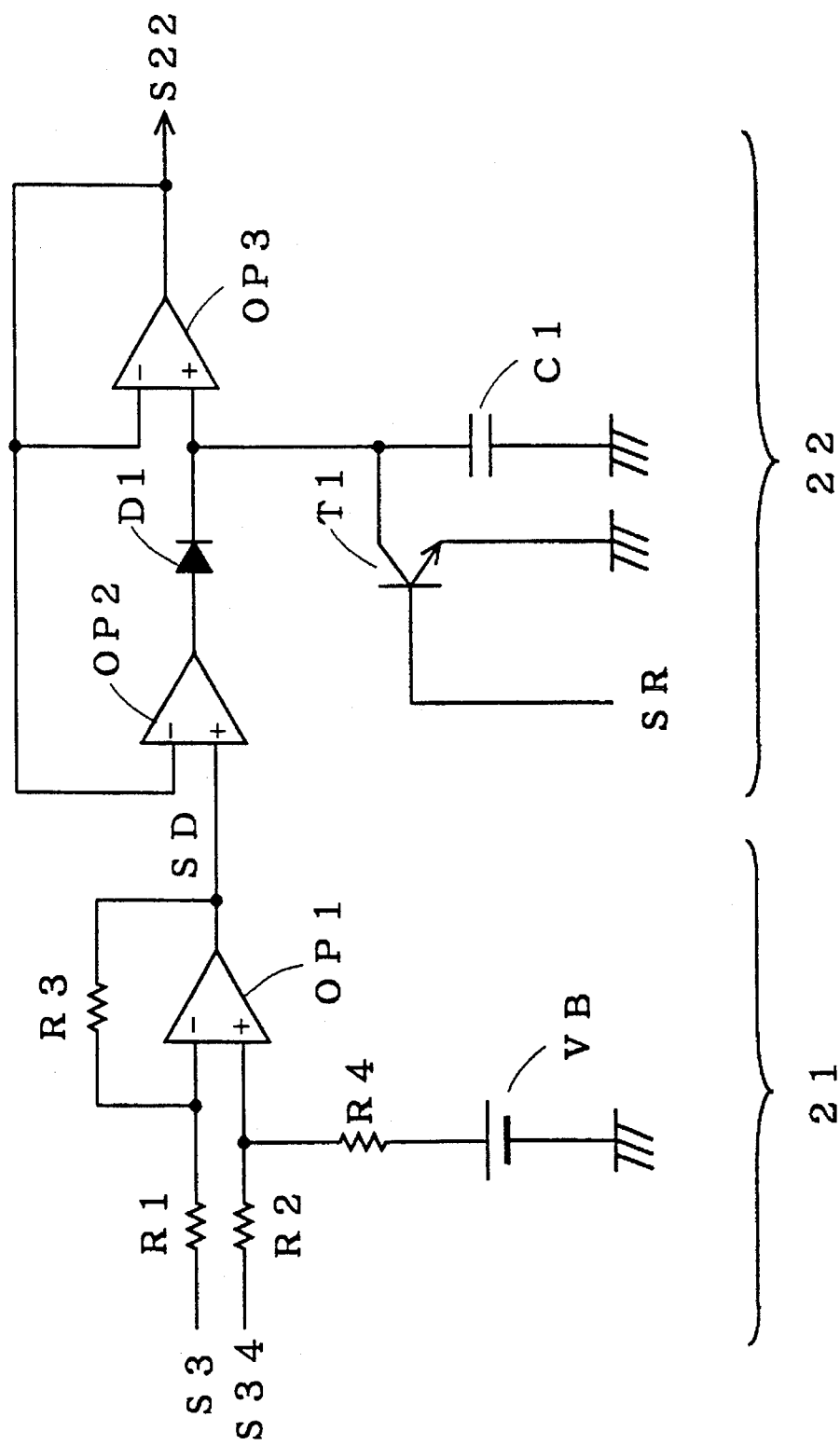
FIG. 3 is a circuit diagram illustrating the internal construction of a subtraction circuit and a peak hold circuit of FIG. 2.

FIG. 3 is a circuit diagram illustrating the internal construction of the subtraction circuit 21 and the peak hold circuit 22. In the subtraction circuit 21, as shown in FIG. 3, the variable-amplitude signal S3 is applied to a first end of a resistor R1, and the intermediate signal S34 is applied to a first end of a resistor R2. The resistor R1 has a second end connected to a negative input of an operational amplifier OP1, and the difference signal SD outputted from the operational amplifier OP1 is fed back to the negative input of the operational amplifier OP1 through a resistor R3. The resistor R2 has a second end connected to a positive input of the operational amplifier OP1 and grounded through a resistor R4 and a bias voltage source VB.

The subtraction circuit 21 having such a construction performs the subtraction of the variable-amplitude signal S3 and the intermediate signal S34 (biased by the bias voltage source) to output the difference signal SD to a positive input of an operational amplifier OP2 in the peak hold circuit 22.

In the peak hold circuit 22, the output of the operational amplifier OP2 is connected to the anode of a diode D1 which has a cathode connected to a positive input of an operational amplifier OP3, to a first electrode of a capacitor C1, and to the collector of an NPN bipolar transistor T1. The output from the operational amplifier OP3 is outputted as the peak signal S22 and is fed back to negative inputs of the operational amplifiers OP2 and OP3. A second electrode of the capacitor C1 and the emitter of the transistor T1 are grounded, and the base of the transistor T1 receives a reset signal SR.

In the peak hold circuit 22 having such a construction, the difference signal SD applied to the positive input of the operational amplifier OP2 charges the capacitor C1 through the diode D1. The capacitor C1 is charged until the increasing difference signal SD reaches its peak, and the voltage is held by the capacitor C1 past the peak.

Consequently, the positive peak voltage of the difference signal SD is accumulated as a holding voltage VH for the first electrode of the capacitor C1. The operational amplifier OP3 buffers the holding voltage VH to output the peak signal S22.

The reset signal SR at a level which permits the transistor T1 to turn on is impressed upon the base of the transistor T1 to reset the holding voltage VH for the capacitor C1 to the ground level through the transistor T1.

Figure 4:
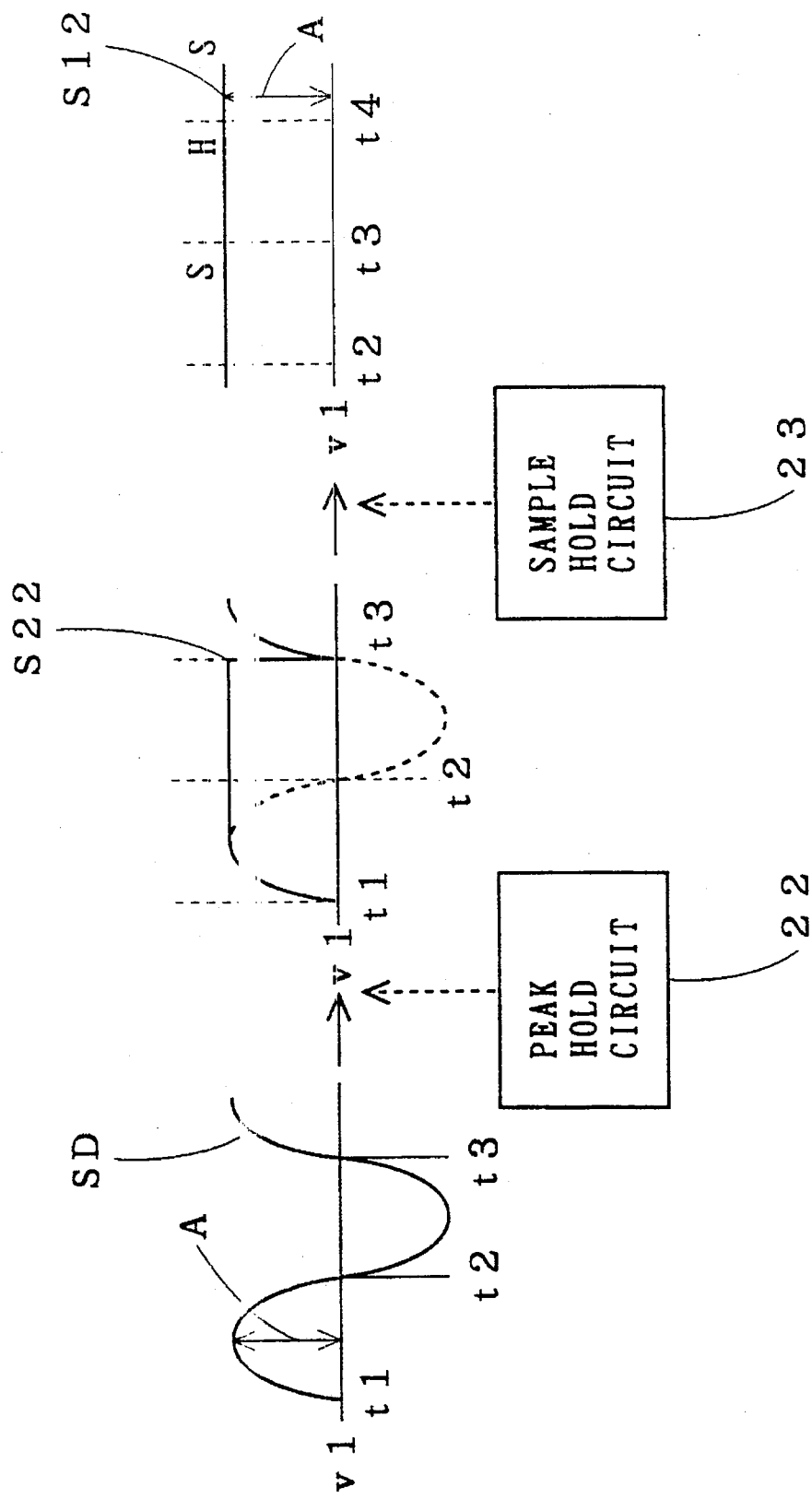
FIG. 4 illustrates the operation of the peak hold circuit and a sample hold circuit.

FIG. 4 illustrates the operation of the peak hold circuit 22 and the sample hold circuit 23 in detail. During the time between t1 and t3, the difference signal SD is subjected to the peak hold processing by the peak hold circuit 22 into the peak signal S22 holding a positive peak value. Further, the peak signal S22 is sampled during the time between t2 and t3 and subjected to the hold processing during the time between t3 and t4 by the sample hold circuit 23 into the peak detection signal S12. At the time t3, the peak hold circuit 22 is reset.

Therefore, setting the reference voltage VR1=(A)+(v1)' when the ideal waveform of the difference signal SD is A' sin θ+(v1)' permits the control signal S14 of the error amplifier 14 to accurately control the signal amplitude adjustment of the AGC circuit 2.

In the sensor drive circuit of the first preferred embodiment shown in FIGS. 1 to 3, the sine-wave oscillating signal outputted from the oscillator circuit 1 amplified by the AGC circuit 2 and applied to the buffer 3. The variable-amplitude signal S3 from the buffer 3 is impressed upon the node N11 at the first end of the reference sensor 5 and upon the inverter 4 which in turn impresses the inverted variable-amplitude signal S4 upon the node N13 at the first end of the variable sensor 6.

Then the variable-amplitude signal S3 and intermediate signal S34 from the first and second ends of the reference sensor 5 are outputted respectively to the first and second inputs of the peak detector circuit 12. The variable-amplitude signal S3 and inverted variable-amplitude signal S4 from the first ends of the reference sensor 5 and variable sensor 6 are outputted respectively to the first and second inputs of the peak detector circuit 13.

The peak value of the difference signal between the variable-amplitude signal S3 and the intermediate signal S34 is detected by the peak detector circuit 12, and the peak detection signal S12 is provided to the first input of the error amplifier 14. The reference voltage VR1 applied to the second input of the error amplifier 14 is previously set to the peak value of the difference signal between the variable-amplitude signal S2 and the intermediate signal S34 when the variable-amplitude signal S3 is the expected sine-wave signal as above stated.

Therefore, when the peak detection signal S12, or the verification signal, is lower than the reference voltage VR1, the error amplifier 14 outputs to the AGC circuit 2 the control signal S14 which directs the AGC circuit 2 to increase the amplitude, and the AGC circuit 2 is controlled so that the amplitude of the output signal increases. On the other hand, when the peak detection signal S12 is higher than the reference voltage VR1, the error amplifier 14 outputs to the AGC circuit 2 the control signal S14 which directs the AGC circuit 2 to decrease the amplitude, and the AGC circuit 2 is controlled so that the amplitude of the output signal decreases.

In this manner, the control signal S14 from the error amplifier 14 controls the output signal from the AGC circuit 2 such that the peak detection signal S12, or the verification signal, becomes equal to the reference voltage VR1, and the amplitude of the difference signal between the variable-amplitude signal S3 and the intermediate signal S34 from the first and second ends of the reference sensor 5 is controlled to be held constant.

The peak value of the difference signal between the variable-amplitude signal S3 and the inverted variable-amplitude signal S4 from the first ends of the reference sensor 5 and variable sensor 6 is detected by the peak detector circuit 13 which in turn outputs the inductance detection signal OUT.

At this time, since the amplitude of the variable-amplitude signal S3 (inverted variable-amplitude signal S4) is held constant by the AGC circuit 2, the relation between the amplitude (A2) of the difference signal of the variable-amplitude signal S3 and inverted variable-amplitude signal S4 and the reference amplitude (A1) of the difference signal of the variable-amplitude signal S3 and intermediate signal S34 is determined by the relational expression using the inductance L0 of the reference sensor 5 and the inductance L1 of the variable sensor 6 as will be described below.

$$A2 = \{(L0+L1)/L0\} \cdot A1$$
$$= (1+L1/L0) \cdot A1$$

That is, the reference amplitude A1 plus (L1/L0)·A1 equals the amplitude A2. Therefore, verification of the voltage of the inductance detection signal OUT allows detection of the amount of variation in inductance L1 by the inverse operation.

As above stated, the sensor drive circuit of the first preferred embodiment controls the amplitude of the output signal from the AGC circuit 2 on the basis of the result of comparison by the error amplifier 14 between the reference voltage VR1 and the voltage level (verification voltage) of the peak detection signal S12 provided by detecting the peak of the amplitude of the difference signal between the signals at the first and second ends of the reference sensor 5.

Thus, the error amplifier 14 receives the peak detection signal S12, or the verification voltage, obtained from the amplitude-uncompressed difference signal between the variable-amplitude signal S3 and the intermediate signal S34. This provides for higher control accuracy by the AGC circuit 2 than the background art. The constant amplitude control is performed accurately if the variable-amplitude signal S3 varies slightly.

Consequently, high-accuracy constant amplitude control of the signals provided at the first and second ends of the reference sensor 5 achieves the effects of increasing the verification accuracy of the inductance L1 of the variable sensor 6.

In addition, the voltage level of the inductance detection signal OUT outputted from the peak detection signal 13 is obtained from the amplitude-uncompressed difference signal between the variable-amplitude signal S3 and the inverted variable-amplitude signal S4. This increases the detection accuracy of the amount of variation in inductance L1 of the variable sensor 6 in response to the inductance detection signal OUT.

Second Preferred Embodiment

Figure 5:
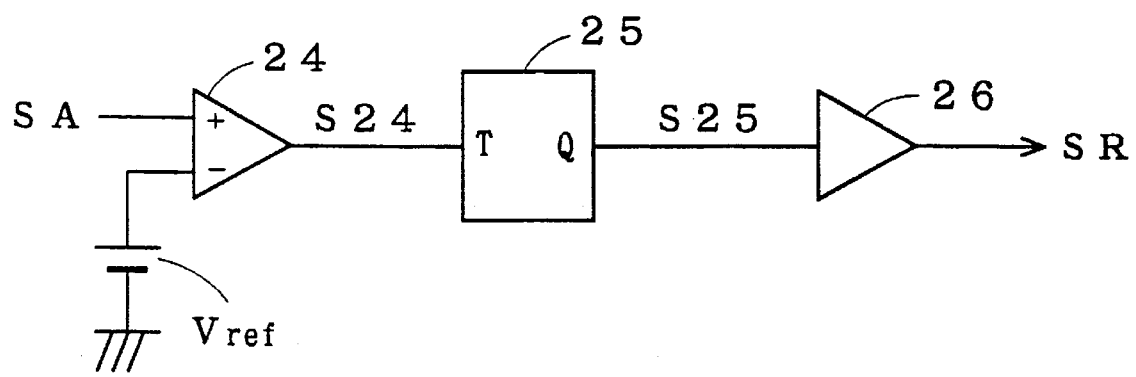
FIG. 5 is a circuit diagram of a reset signal generator circuit for the sensor drive circuit according to a second preferred embodiment of the present invention.

FIG. 5 is a circuit diagram of a reset signal generator circuit for the sensor drive circuit according to a second preferred embodiment of the present invention.

A comparator 24 receives a control signal SA at its positive input and a reference voltage $V_{ref}$ at its negative input, and provides a comparison result signal S24 to a 1/n frequency divider 25. The 1/n frequency divider 25 divides the frequency of the comparison result signal S24 by n to output a frequency-divided signal S25 to a differentiation circuit 26. The differentiation circuit 26 differentiates the frequency-divided signal S25 to output the reset signal SR to the base of the transistor T1 in the peak hold circuit 22 shown in FIG. 3.

The second preferred embodiment is similar in construction to the first preferred embodiment shown in FIGS. 1 to 3 except the reset signal generator circuit, and the description of other portions will be omitted herein.

Figure 6:
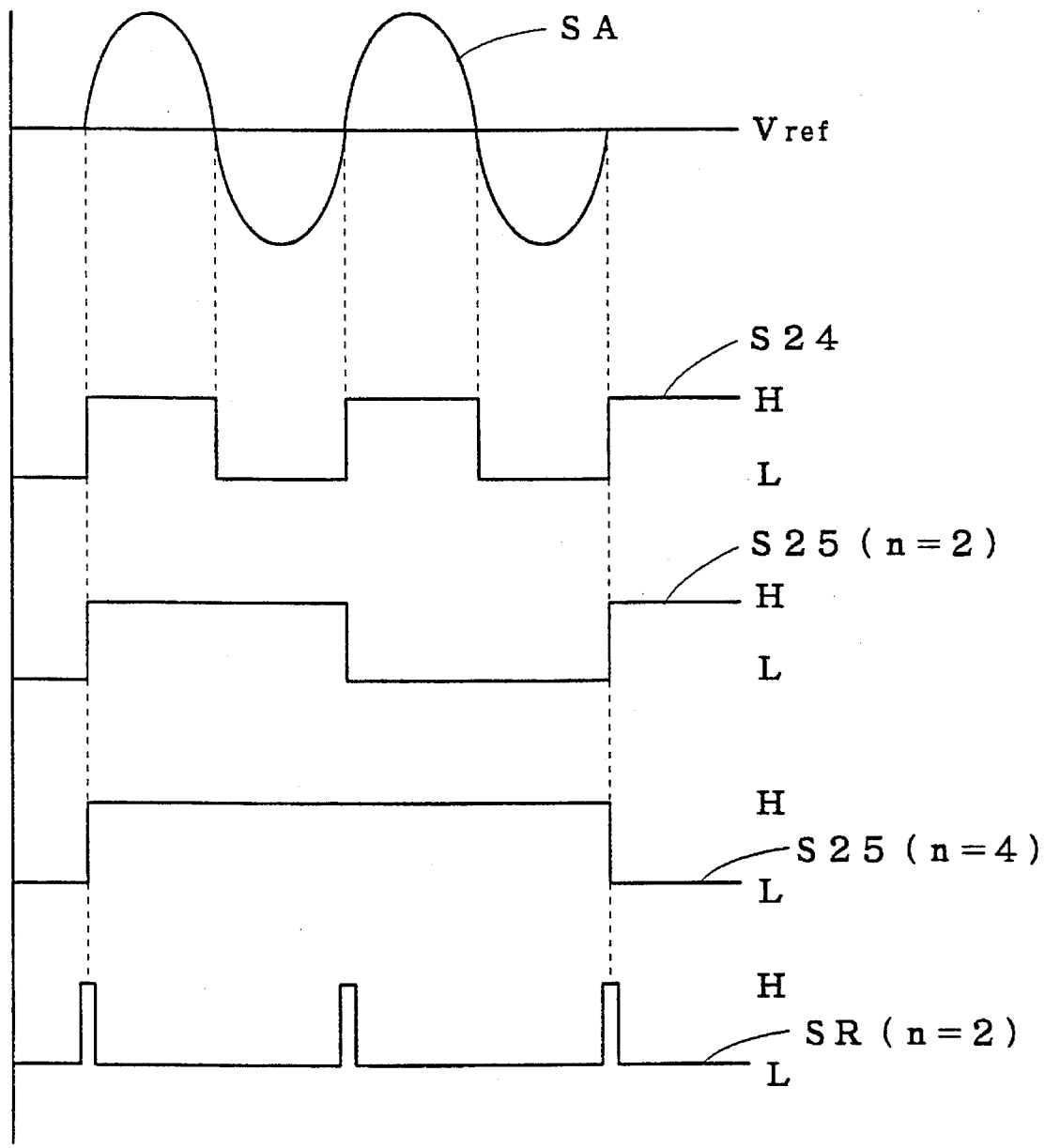
FIG. 6 is a waveform chart illustrating the operation of the second preferred embodiment.

FIG. 6 is a waveform chart illustrating the operation of the reset signal generator circuit shown in FIG. 5. Referring to FIG. 6, the control signal SA varying with respect to the reference voltage $V_{ref}$ is compared with the reference voltage $V_{ref}$ by the comparator 24, and the comparison result signal S24 is provided. The comparison result signal S24 is frequency-divided by n by the 1/n frequency divider 25, and the frequency-divided signal S25 is provided. The frequency-divided signal S25 is differentiated by the differentiation circuit 26, and the reset signal SR is provided. When an H level pulse of the reset signal SR is generated, the transistor T1 (FIG. 3) turns on and the peak hold circuit 22 is reset.

In this manner, the sensor drive circuit of the second preferred embodiment comprises the reset signal generator circuit which accurately varies the peak detection and hold processing time periods in the peak hold circuit 22 in response to the control signal SA.

Third Preferred Embodiment

Figure 7:
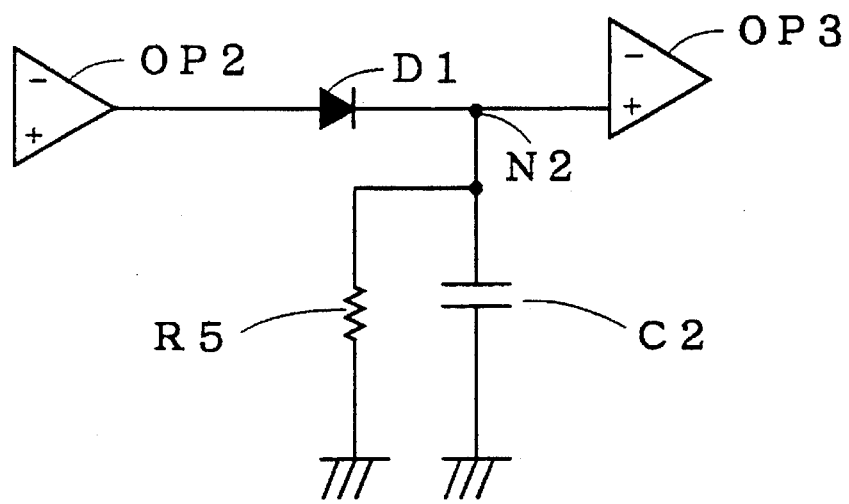
FIG. 7 is a circuit diagram of a part of the peak hold circuit for the sensor drive circuit according to a first feature of a third preferred embodiment of the present invention.

FIG. 7 is a circuit diagram of a part of the peak hold circuit 22 for the sensor drive circuit according to a first feature of a third preferred embodiment of the present invention.

Referring to FIG. 7, a capacitor C2 and a resistor R5 are connected in parallel between a node N2 between the operational amplifiers OP2 and OP3 and ground in the peak hold circuit 22.

The first feature of the third preferred embodiment is similar in construction to the first preferred embodiment shown in FIGS. 1 to 3 except the peak hold circuit 22.

Figure 9:
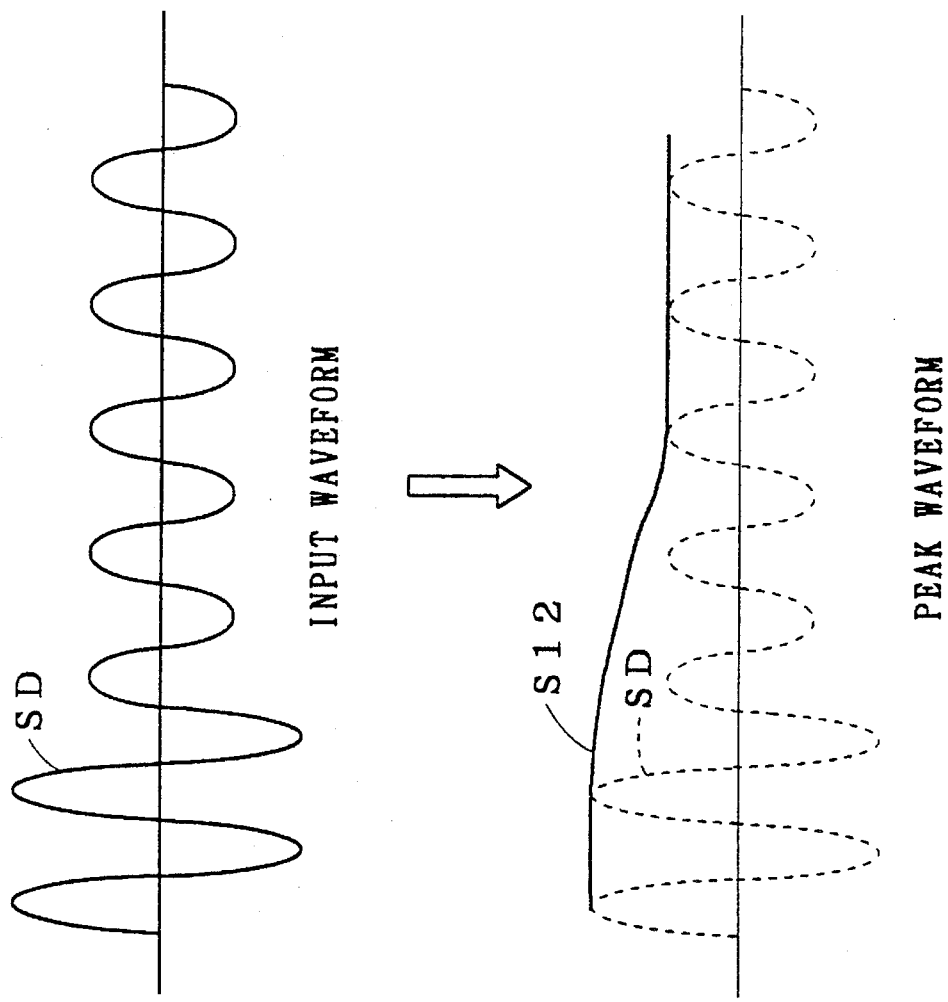
FIG. 9 is a waveform chart illustrating the operation of the third preferred embodiment.

FIG. 9 is a waveform chart illustrating the operation of the first feature of the third preferred embodiment shown in FIG. 7. As shown in FIG. 9, since a time constant determined by the capacitance of the capacitor C2 and the resistance of the resistor R5 triggers a reset when the difference signal SD is entered, the waveform of the peak signal S22 follows the waveform of the difference signal SD.

Figure 8:
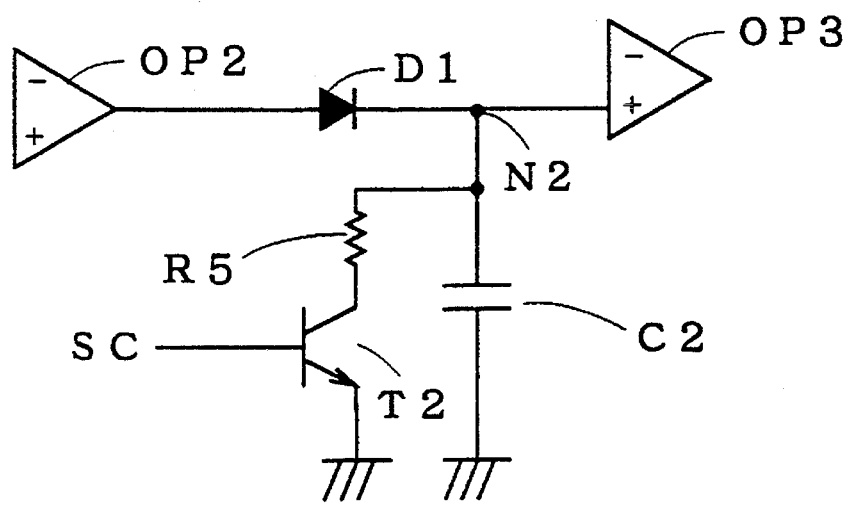
FIG. 8 is a circuit diagram of a part of the peak hold circuit for the sensor drive circuit according to a second feature of the third preferred embodiment of the present invention.

FIG. 8 is a circuit diagram of a part of the peak hold circuit 22 for the sensor drive circuit according to a second feature of the third preferred embodiment of the present invention. Referring to FIG. 8, an NPN bipolar transistor T2 is further connected between the resistor R5 and ground, and a control signal SC is applied to the base of the transistor T2. Other constructions of the second feature of the third preferred embodiment are similar to those of the first feature thereof.

In such a construction, turning on of the transistor T2 provides the effects of the first feature. In addition, turning on/off of the transistor T2 in response to the control signal SC can force the reset operation.

Fourth Preferred Embodiment

Figure 10:
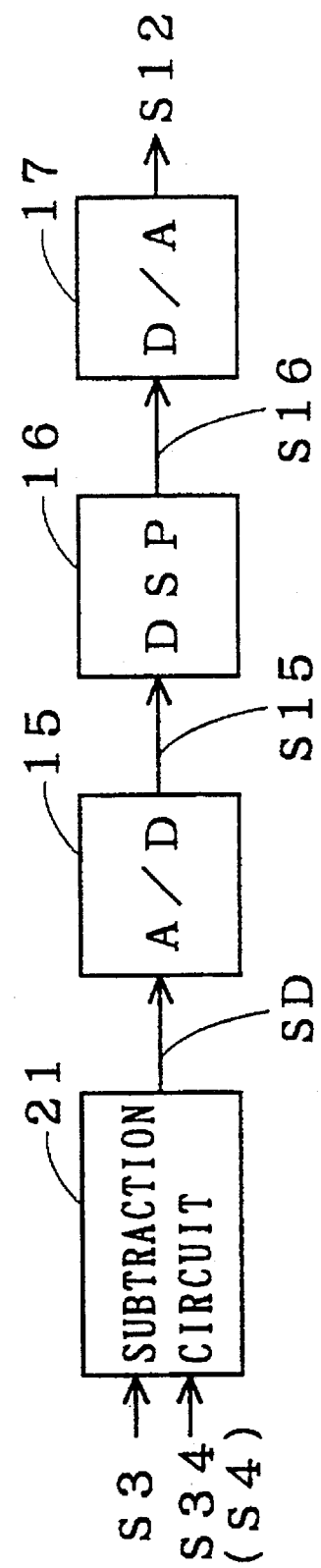
FIG. 10 is a block diagram illustrating the internal construction of the peak detector circuit for the sensor drive circuit according to a fourth preferred embodiment of the present invention.

FIG. 10 is a block diagram illustrating the internal construction of the peak detector circuit 12 (13) for the sensor drive circuit according to a fourth preferred embodiment of the present invention. The peak detector circuit 12 comprises the subtraction circuit 21, an A/D converter 15, a DSP (digital signal processor) 16, and a D/A converter 17 as shown in FIG. 10.

The subtraction circuit 21 receives the variable-amplitude signal S3 and the intermediate signal S34 (the inverted variable-amplitude signal S4 in the peak detector circuit 13) and performs subtraction of the variable-amplitude signal S3 and the intermediate signal S34 to output the difference signal SD to the A/D converter 15.

The A/D converter 15 converts the analog difference signal SD to a digital difference signal S15 to output the digital difference signal S15 to the DSP 16.

The DSP 16 detects a positive peak value of the digital difference signal S15 during a predetermined sampling time period to output a digital peak signal S16 to the D/A converter 17.

The D/A converter 17 converts the digital peak signal S16 to the analog peak detection signal S12 to output the peak detection signal S12.

Figure 11:
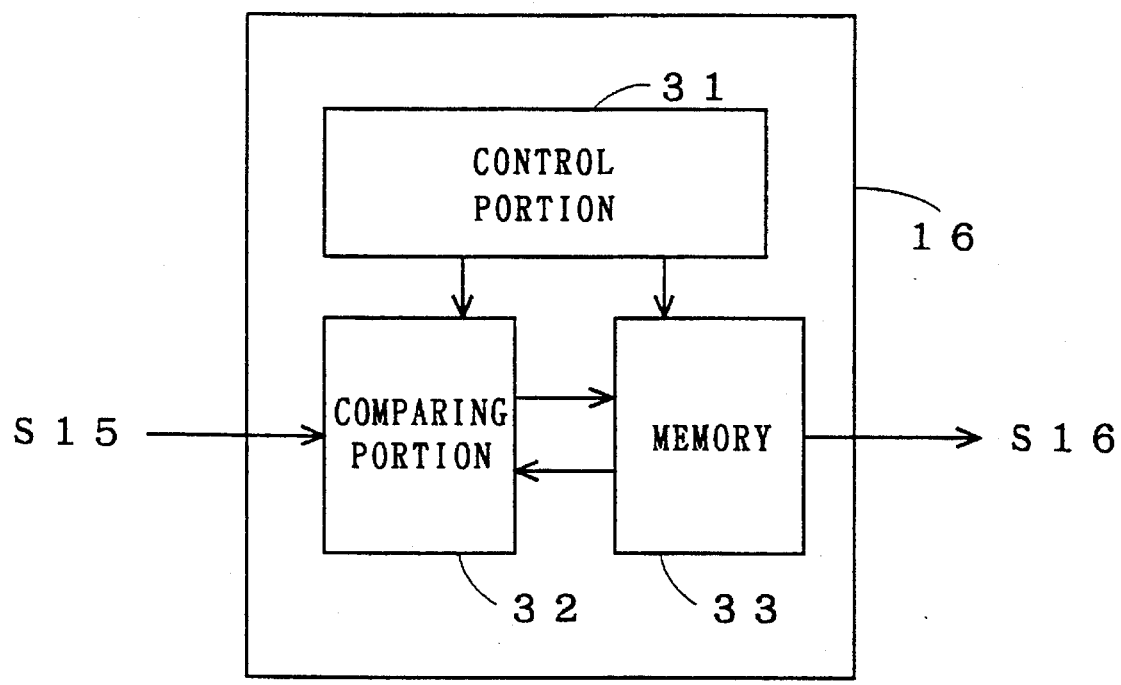
FIG. 11 is a circuit diagram illustrating the internal construction of a DSP of FIG. 10.

FIG. 11 is a block diagram illustrating the internal construction of the DSP 16. The DSP includes a control portion 31, a comparing portion 31, and a memory 33 as shown in FIG. 11. The comparing portion 32 compares the digital difference signal S15 with peak data stored in the memory 33 when it is active. When the digital difference signal S15 is greater than the peak data, the comparing portion 32 overwrites the digital difference signal S15 as new peak data onto the memory 33.

The control portion 31 transmits a control signal to the comparing portion 32 and the memory 33 to control the activation/inactivation of the comparing portion 32 and the initialization of the peak data in the memory 33, thereby to store the peak value of the digital difference signal S15 during a predetermined sampling time period as the peak data in the memory 33 and output the peak data as the digital peak signal S16 to the D/A converter 17.

Figure 12:
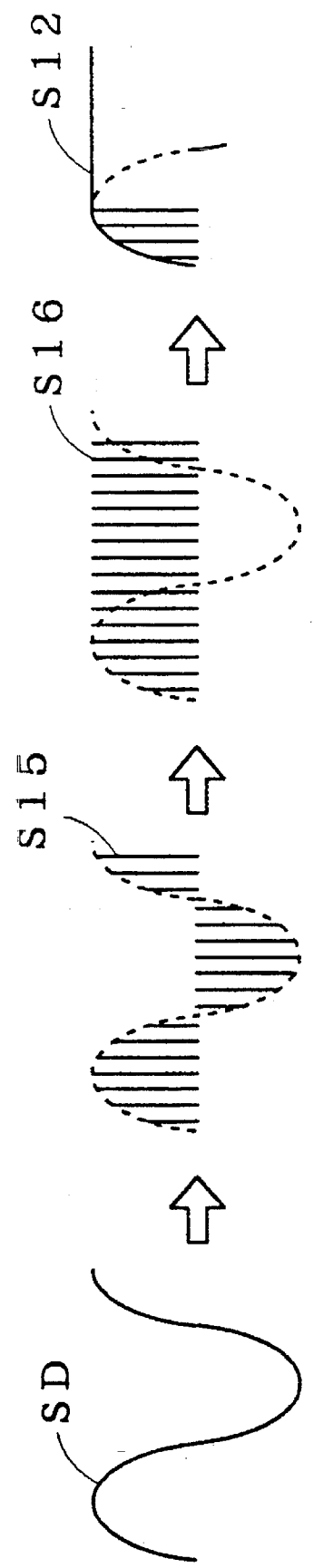
FIG. 12 illustrates the operation of the fourth preferred embodiment.

FIG. 12 illustrates the operation of the peak detector circuit of the fourth preferred embodiment. Referring to FIG. 12, the difference signal SD is analog-to-digital converted into the digital difference signal S15 by the A/D converter 15. The digital difference signal S15 is subjected to the peak detecting processing during the predetermined sampling time period into the digital peak signal S16 by the DSP 16. The digital peak signal S16 is digital-to-analog converted into the peak detection signal S12 by the D/A converter 17.

As above stated, the sensor drive circuit of the fourth preferred embodiment allows the digital processing by the DSP to detect the peak value of the difference signal SD without being affected by noises.

Fifth Preferred Embodiment

Figure 13:
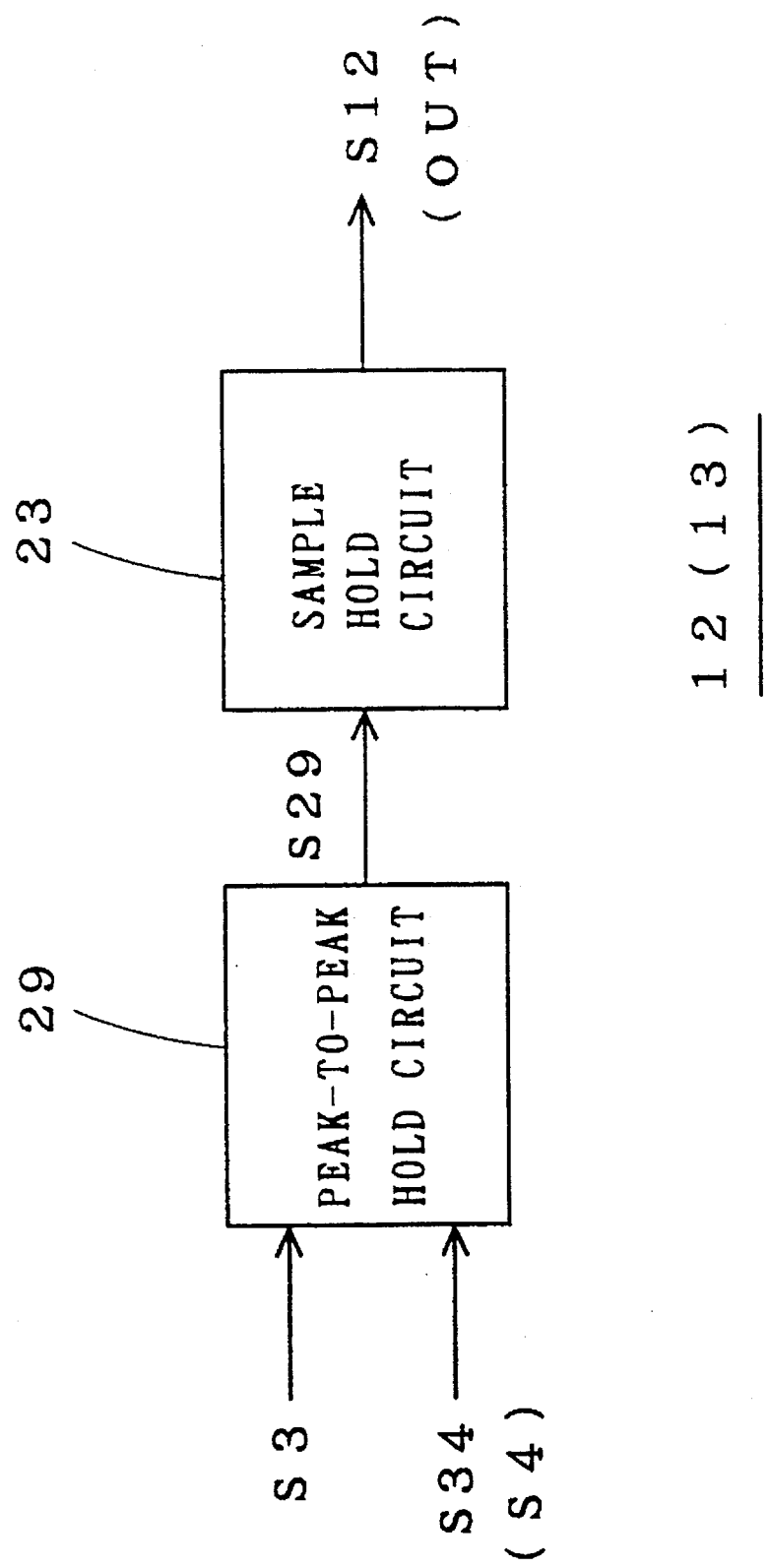
FIG. 13 is a block diagram of the peak detector circuit for the sensor drive circuit according to a fifth preferred embodiment of the present invention.

FIG. 13 is a block diagram illustrating the internal construction of the peak detector circuit 12 for the sensor drive circuit according to a fifth preferred embodiment of the present invention. The peak detector circuit 12 includes a peak-to-peak hold circuit 29 and the sample hold circuit 23 as shown in FIG. 13.

The peak-to-peak hold circuit 29 receives the variable-amplitude signal S3 and the intermediate signal S34 (the inverted variable-amplitude signal S4 in the peak detector circuit 13) and detects a peak-to-peak value which is a difference between the positive peak value of the variable-amplitude signal S3 and the negative peak value of the intermediate signal S34. The peak-to-peak hold circuit 29 then holds the peak-to-peak value and outputs a peak-to-peak signal S29 to the sample hold circuit 23.

The sample hold circuit 23 samples the peak-to-peak signal S29 for the predetermined sampling time period to output the peak detection signal S12 (the inductance detection signal OUT in the peak detector circuit 13).

Figure 14:
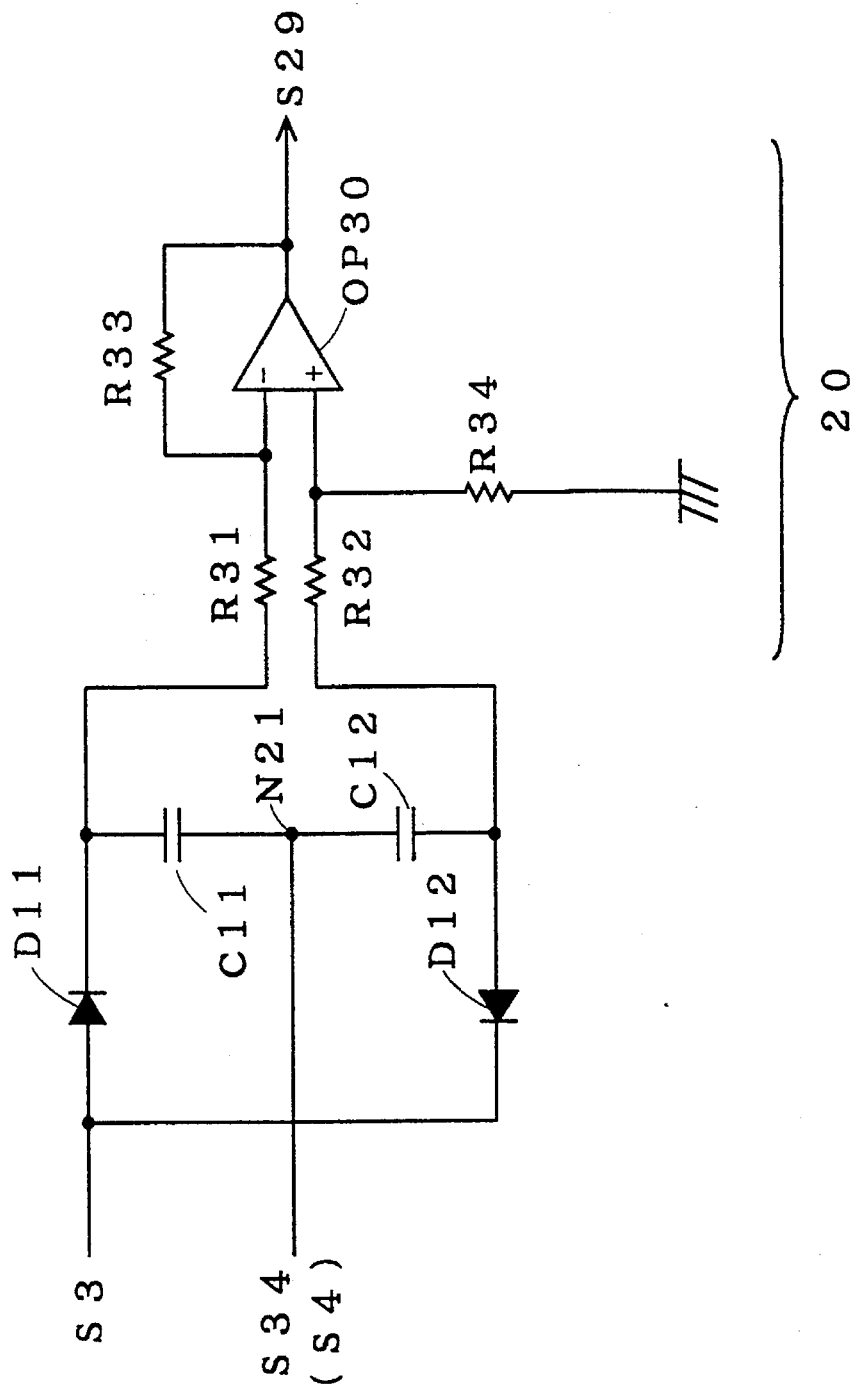
FIG. 14 is a circuit diagram of a peak-to-peak hold circuit of FIG. 13 according to a first feature.

FIG. 14 is a circuit diagram illustrating the internal construction of the peak-to-peak hold circuit 29 according to a first feature. Referring to FIG. 14, a diode D11 has an anode receiving the variable-amplitude signal S3 and a cathode connected to a first electrode of a capacitor C11. A diode D12 has a cathode receiving the variable-amplitude signal S3 and an anode connected to a first electrode of a capacitor C12. The intermediate signal S34 is applied to a node N21 between a second electrode of the capacitor C11 and a second electrode of the capacitor C12.

The first electrode of the capacitor C11 is connected to a first end of a resistor R31, and the first electrode of the capacitor C12 is connected to a first end of a resistor R32. A second end of the resistor R31 is connected to a negative input of an operational amplifier OP30, and the peak-to-peak signal S29 outputted from the operational amplifier OP30 is fed back to the negative input thereof through a resistor R33. A second end of the resistor R32 is connected to a positive input of the operational amplifier OP30 and is grounded through a resistor R34. The above described operational amplifier OP30 and the resistors R31 to R34 form a subtraction circuit 20.

In such a construction, the variable-amplitude signal S3 is applied to the first electrode of the capacitor C11 through the diode D11 connected in the forward direction, and the intermediate signal S34 is applied directly to the second electrode of the capacitor C11. Then the difference signal between the variable-amplitude signal S3 and the intermediate signal S34 charges the capacitor C11 until it reaches its positive peak. The voltage is held by the capacitor C11 past the peak.

The variable-amplitude signal S3 is applied to the first electrode of the capacitor C12 through the diode D12 connected in the reverse direction, and the intermediate signal S34 is applied directly to the second electrode of the capacitor C12. Then the difference signal between the variable-amplitude signal S3 and the intermediate signal S34 charges the capacitor C12 until it reaches its negative peak. The voltage is held by the capacitor C12 past the peak.

Consequently, the positive peak voltage of the difference signal between the variable-amplitude signal S3 and the intermediate signal S34 is held at the first electrode of the capacitor C11, and the negative peak voltage of the difference signal therebetween is held at the first electrode of the capacitor C12.

The subtraction circuit 20 subtracts the negative peak voltage applied to the first end of the resistor S32 from the positive peak voltage applied to the first end of the resistor R31. The result of the subtraction which is the peak-to-peak signal S29 is outputted from the subtraction circuit 20.

Figure 15:
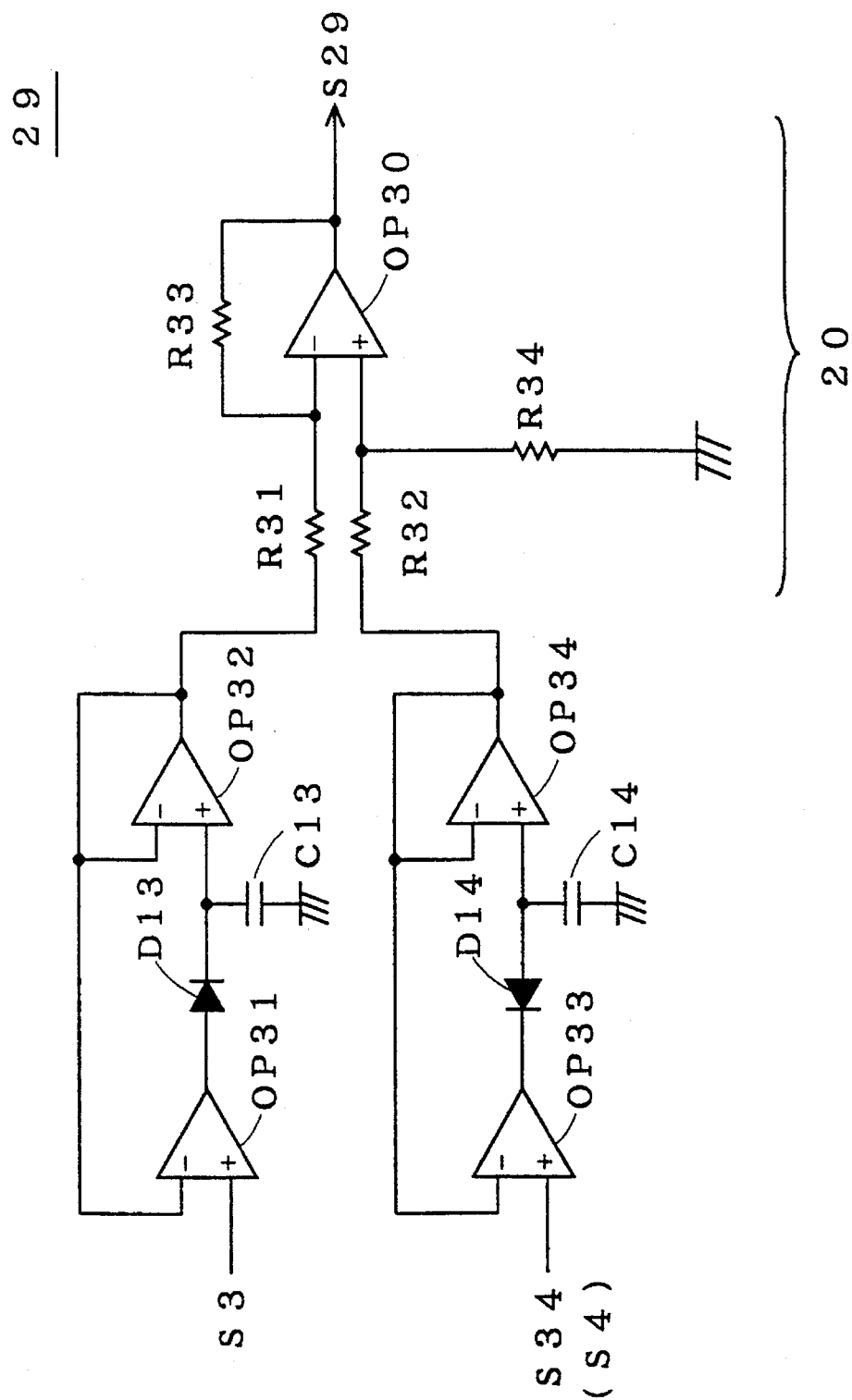
FIG. 15 is a circuit diagram of the peak-to-peak hold circuit of FIG. 13 according to a second feature.

FIG. 15 is a circuit diagram illustrating the internal construction of the peak- to-peak hold circuit 29 according to a second feature. Referring to FIG. 15, the variable-amplitude signal S3 is applied to a positive input of an operational amplifier OP31. The output of the operational amplifier OP31 is connected to the anode of a diode D13, and the cathode of the diode D13 is connected to a positive input of an operational amplifier OP32 and a first electrode of a capacitor C13. The output from the operational amplifier OP32 is fed back to negative inputs of the operational amplifiers OP32 and OP31. A second electrode of the capacitor C13 is grounded.

The intermediate signal S34 is applied to a positive input of an operational amplifier OP33. The output of the operational amplifier OP33 is connected to the cathode of a diode D14, and the anode of the diode D14 is connected to a positive input of an operational amplifier OP34 and a first electrode of a capacitor C14. The output from the operational amplifier OP34 is fed back to negative inputs of the operational amplifiers OP34 and OP33. A second electrode of the capacitor C14 is grounded.

The output of the operational amplifier OP32 is connected to the first end of the resistor R31 in the subtraction circuit 20, and the output of the operational amplifier OP34 is connected to the first end of the resistor R32 in the subtraction circuit 20. The subtraction circuit 20 of the second feature is similar in construction to that of the first feature, and the description thereof will be omitted herein.

In such a construction, when the variable-amplitude signal S3 is applied to the positive input of the operational amplifier OP31 and the intermediate signal S34 is applied to the positive input of the operational amplifier OP33, the charging to the capacitor C13 permits the capacitor C13 to hold the positive peak voltage of the variable-amplitude signal S3, and the discharging from the capacitor C14 permits the capacitor C14 to hold the negative peak voltage of the intermediate signal S34. The positive peak voltage and the negative peak voltage are buffered by the operational amplifiers OP32 and OP34 and applied to the first ends of the resistors R31 and R32 in the subtraction circuit 20, respectively.

The subtraction circuit 20 subtracts the negative peak voltage applied to the first end of the resistor R32 from the positive peak voltage applied to the first end of the resistor R31. The result of the subtraction which is the peak-to-peak signal S29 is outputted from the subtraction circuit 20.

Figure 16:
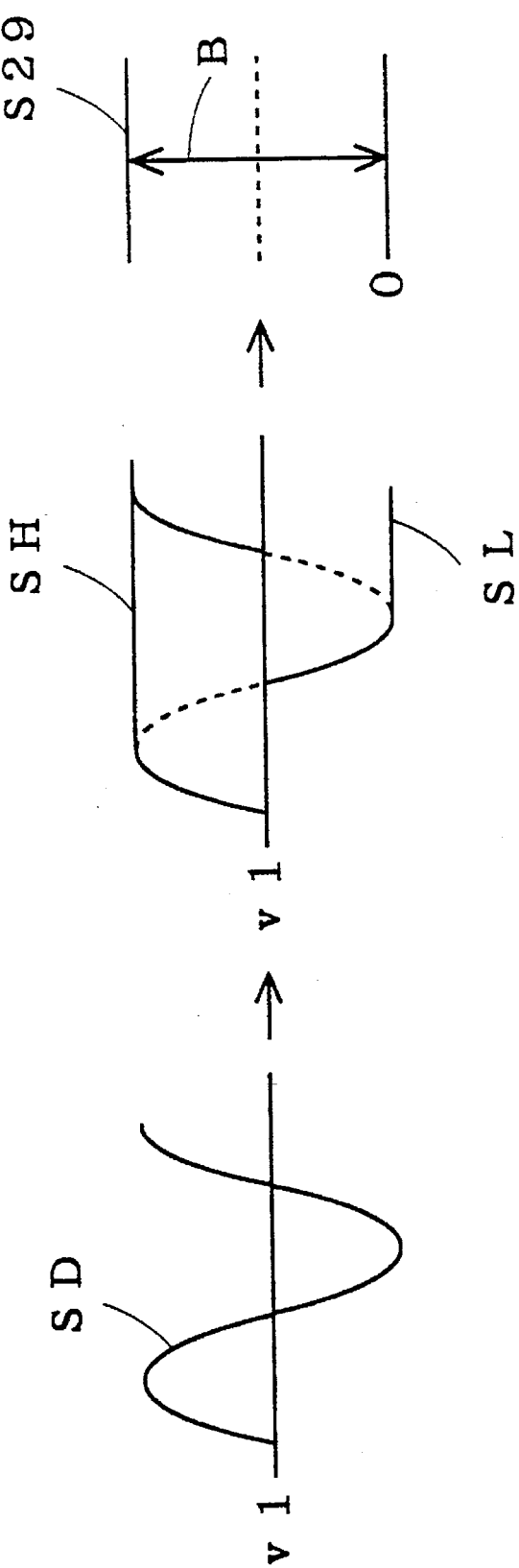
FIG. 16 illustrates the operation of the fifth preferred embodiment.

FIG. 16 illustrates the operation of the peak-to-peak hold circuit 29. As shown in FIG. 16, a positive peak value SH and a negative peak value SL of the difference signal SD between the variable-amplitude signal S3 and the intermediate signal S34 are held, and a signal having an amplitude B which is the difference between the positive peak value SH and the negative peak value SL is the peak-to-peak signal S29.

As above stated, the sensor drive circuit of the fifth preferred embodiment determines the peak detection signal S12 which is the difference between the positive and negative peaks of the amplitude of the difference signal between the signals provided at the first and second ends of the reference sensor 5 and controls the amplitude of the output signal from the AGC circuit 2 on the basis of the result of comparison by the error amplifier 14 between the voltage level (verification voltage) of the peak detection signal S12 and the reference voltage VR1.

Thus, the error amplifier 14 receives the peak detection signal S12, or the verification voltage, obtained from the difference signal between the variable-amplitude signal S3 and the intermediate signal S34, with the amplitude of the difference signal uncompressed in the positive and negative directions. This provides for higher control accuracy by the AGC circuit 2 than the first preferred embodiment. The constant amplitude control is performed accurately if the variable-amplitude signal S3 varies slightly.

Consequently, higher-accuracy constant amplitude control of the signals provided at the first and second ends of the reference sensor 5 achieves the effects of further increasing the verification accuracy of the inductance L1 of the variable sensor 6.

In addition, the voltage level of the inductance detection signal OUT outputted from the peak detection signal 13 is obtained from the difference signal between the variable-amplitude signal S3 and the inverted variable-amplitude signal S4, with the amplitude of the difference signal uncompressed in the positive and negative directions. This further increases the detection accuracy of the amount of variation in inductance L1 of the variable sensor 6 in response to the inductance detection signal OUT.

Sixth Preferred Embodiment

Figure 17:
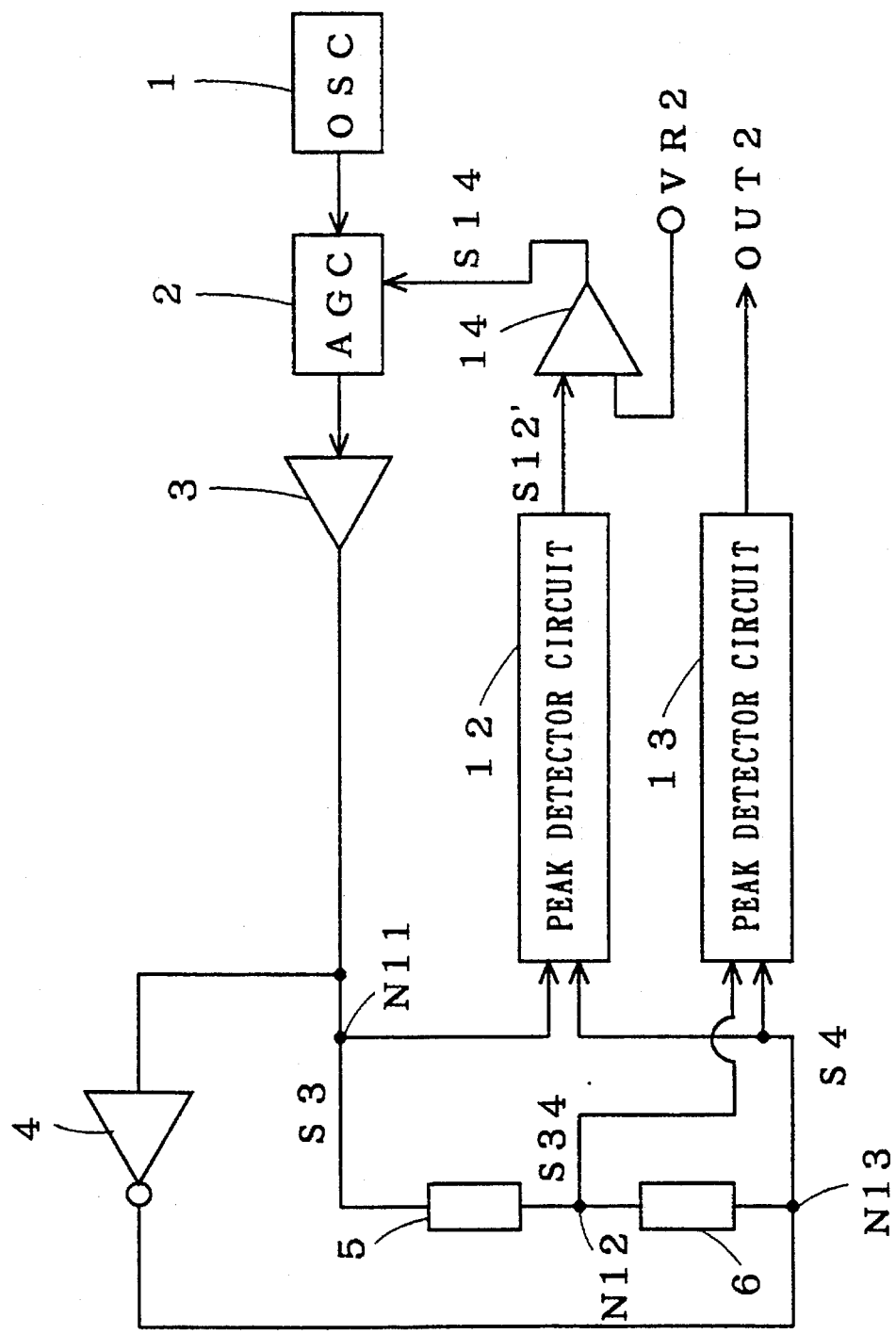
FIG. 17 is a block diagram of the sensor drive circuit according to a sixth preferred embodiment of the present invention.

FIG. 17 is a block diagram of the sensor drive circuit according to a sixth preferred embodiment of the present invention. Referring to FIG. 17, the peak detector circuit 12 detects the peak value of the difference signal between the variable-amplitude signal S3 from the buffer 3 and the inverted variable-amplitude signal S4 from the inverter 4 and outputs a peak detection signal S12' as a verification signal to the first input of the error amplifier 14. The error amplifier 14 has a second input receiving a reference voltage VR2 and outputs the control signal S14 to the AGC circuit 2 on the basis of the result of comparison between the peak detection signal S12' and the reference voltage VR2. The reference voltage is set to VR2=(B)+(v2)' when the ideal waveform of the difference signal between the variable-amplitude signal S3 and the inverted variable-amplitude signal S4 is B' $\sin\theta$+(v2)'.

The peak detector circuit 13 detects a positive peak value of the difference signal between the intermediate signal S34 and the inverted variable-amplitude signal S4 and outputs the peak value as an inductance detection signal OUT2 to the exterior.

Other constructions and the internal construction of the peak detector circuits 12, 13 of the sixth preferred embodiment are similar to those of the first preferred embodiment, and the description thereof will be omitted herein.

Such a construction permits the control signal S14 from the error amplifier 14 to control the output signal from the AGC circuit 2 such that the peak detection signal S12' becomes equal to the reference voltage VR2 on the same principle as the first preferred embodiment, and the amplitude of the difference signal between the variable-amplitude signal S3 and the inverted variable-amplitude signal S4 is controlled to be held constant.

The peak value of the difference signal between the intermediate signal S34 and the inverted variable-amplitude signal S4 is detected by the peak detector circuit 13 and outputted as the inductance detection signal OUT2.

At this time, the amplitude of the variable-amplitude signal S3 (the inverted variable-amplitude signal S4) is controlled so as to be held constant. Thus, the relation between the amplitude (A3) of the difference signal of the intermediate signal S34 and inverted variable-amplitude signal S4 and the reference amplitude (A2) of the difference signal of the variable-amplitude signal S3 and inverted variable-amplitude signal S4 is determined by the relational expression using the inductance L0 of the reference sensor 5 and the inductance L1 of the variable sensor 6 as described below.

$$A3=\{L1/(L0+L1)\} \cdot A2$$

Therefore, on thee same principle as the first preferred embodiment, verification of the voltage of the inductance detection signal OUT2 permits detection of the amount of variation in inductance L1 by the inverse operation.

In this manner, the amplitude of the output signal from the AGC circuit 2 is controlled on the basis of the result of comparison by the error amplifier 14 between the reference voltage VR2 and the voltage level of the peak detection signal S12' provided by detecting the peak of the amplitude of the difference signal between the signals at the respective first ends of the reference sensor 5 and variable sensor 6, and the amount of variation in inductance L1 of the variable sensor 6 is detected in response to the inductance detection signal OUT2 provided by detecting the peak of the difference signal between the intermediate signal S34 and the inverted variable-amplitude signal S4, thereby achieving effects similar to those of the first preferred embodiment.

The second to fifth preferred embodiments are modifications based on the sensor drive circuit of the first preferred embodiment, but may be applicable as modifications based on the sensor drive circuit of the sixth preferred embodiment.

Seventh Preferred Embodiment

Figure 18:
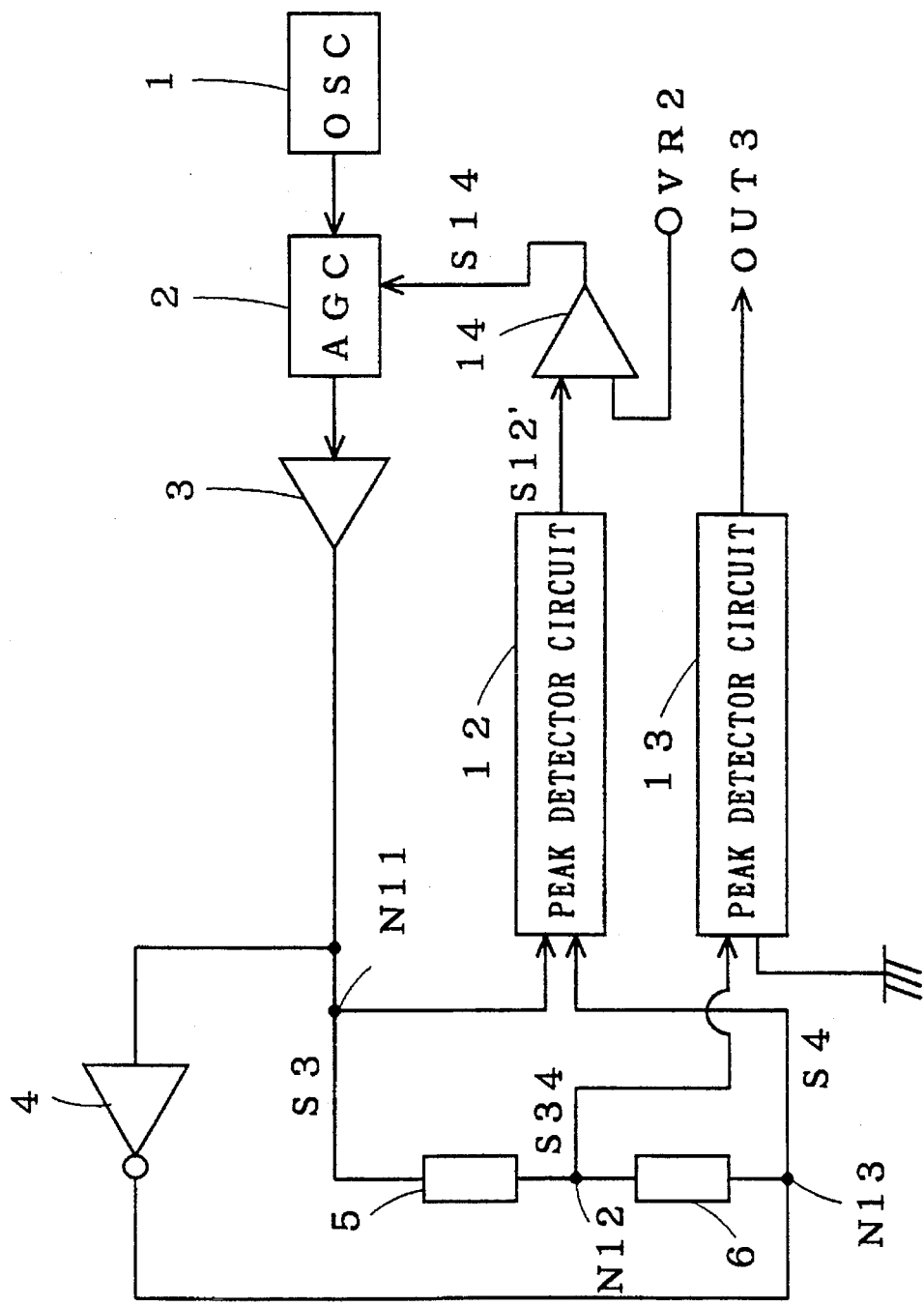
FIG. 18 is a block diagram of the sensor drive circuit according to a seventh preferred embodiment of the present invention.

FIG. 18 is a block diagram of the sensor drive circuit according to a seventh preferred embodiment of the present invention. Referring to FIG. 18, the peak detector circuit 13 detects a positive peak value of a difference signal between the intermediate signal S34 and the GND level, i.e. a positive peak value of the intermediate signal S34 itself, and outputs the peak value as an inductance detection signal OUT3 to the exterior.

Other constructions of the seventh preferred embodiment are similar to those of the sensor drive circuit of the sixth preferred embodiment, and the description thereof will be omitted herein.

In this manner, like the sixth preferred embodiment, the amplitude of the output signal from the AGC circuit 2 is controlled on the basis of the result of comparison by the error amplifier 14 between the reference voltage VR2 and the voltage level of the peak detection signal S12' provided by detecting the peak of the amplitude of the difference signal between the signals at the respective first ends of the reference sensor 5 and variable sensor 6, and the amount of variation in inductance L1 of the variable sensor 6 is detected in response to the inductance detection signal OUT3 provided by detecting the peak of the intermediate signal S34 itself, thereby achieving effects similar to those of the first and sixth preferred embodiments.

When the internal construction of the peak detector circuit 13 is not the construction shown in FIG. 2 but is adapted such that the intermediate signal S34 is applied directly to the peak hold circuit 22, the subtraction circuit need not be provided in the peak detector circuit which receives only the intermediate signal S34 in the seventh preferred embodiment.

The second to fifth preferred embodiments are modifications based on the sensor drive circuit of the first preferred embodiment, but may be applicable as modifications based on the sensor drive circuit of the seventh preferred embodiment.

Eighth Preferred Embodiment

Figure 19:
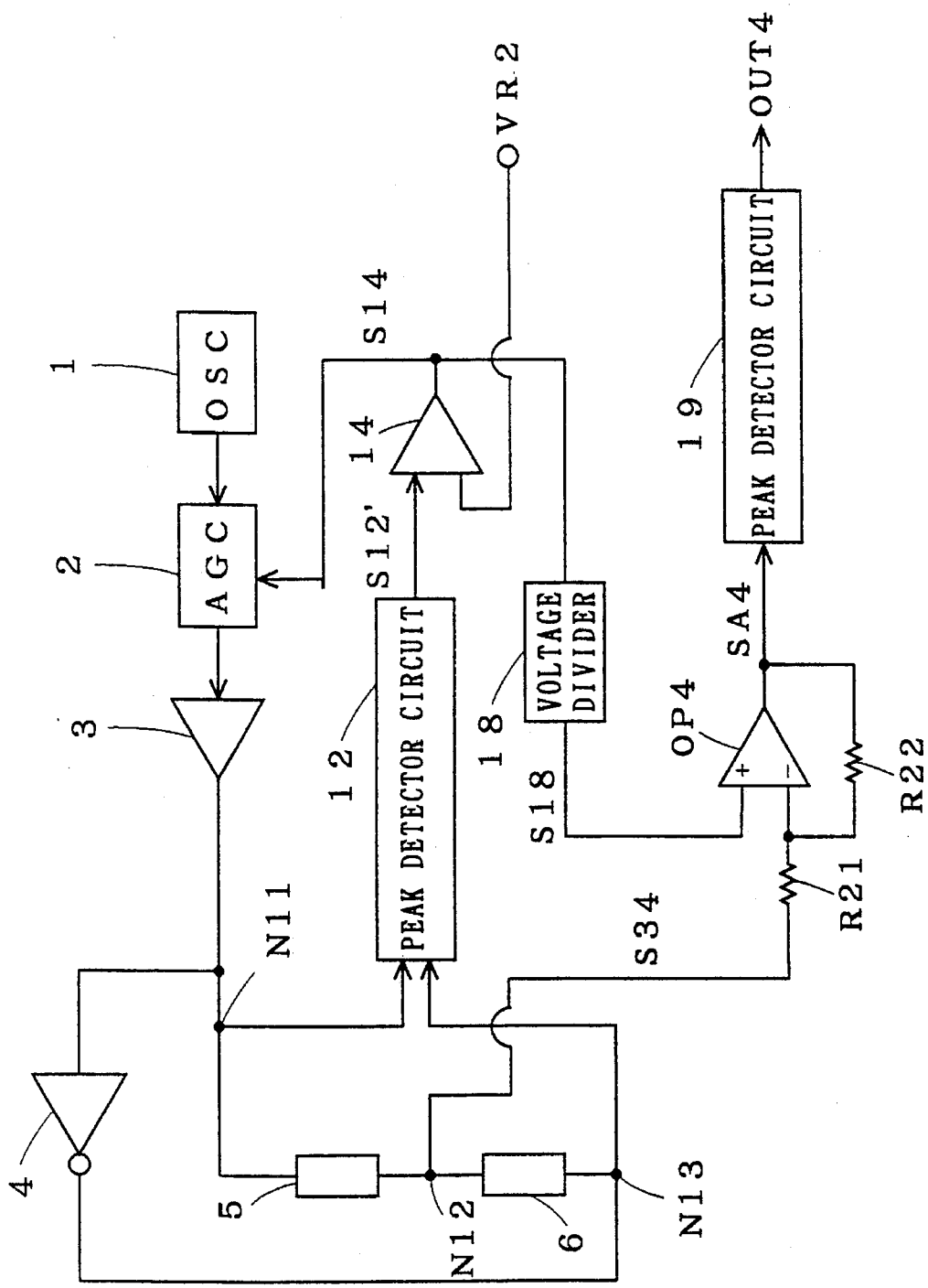
FIG. 19 is a block diagram of the sensor drive circuit according to a first feature of an eighth preferred embodiment of the present invention.

FIG. 19 is a block diagram of the sensor drive circuit according to an eighth preferred embodiment of the present invention. Referring to FIG. 19, the control signal S14 from the error amplifier 14 is outputted to the AGC circuit 2 and to a voltage divider 18. The voltage divider 18 divides the voltage of the control signal S14 by K (K>1) and outputs a voltage-divided signal S18 to a positive input of an operational amplifier OP4.

The operational amplifier OP4 receives the intermediate signal S34 through a resistor R21 and outputs an amplified signal SA4 of the difference between the voltage-divided signal S18 and the intermediate signal S34 to a peak detector circuit 19.

The peak detector circuit 19 detects a positive peak value of the amplified signal SA4 and outputs the peak value as an inductance detection signal OUT4 to the exterior.

In this manner, like the sixth and seventh preferred embodiments, the amplitude of the output signal from the AGC circuit 2 is controlled on the basis of the result of comparison by the error amplifier 14 between the reference voltage VR2 and the voltage level of the peak detection signal S12' provided by detecting the peak of the amplitude of the difference signal between the signals at the respective first ends of the reference sensor 5 and variable sensor 6, and the amount of variation in inductance L1 of the variable sensor 6 is detected in response to the inductance detection signal OUT4 provided by detecting the peak of the amplified signal of the difference between the intermediate signal S34 and the voltage-divided signal S18 given by dividing the voltage of the control signal S14, thereby achieving effects similar to those of the first, sixth and seventh preferred embodiments.

Figure 20:
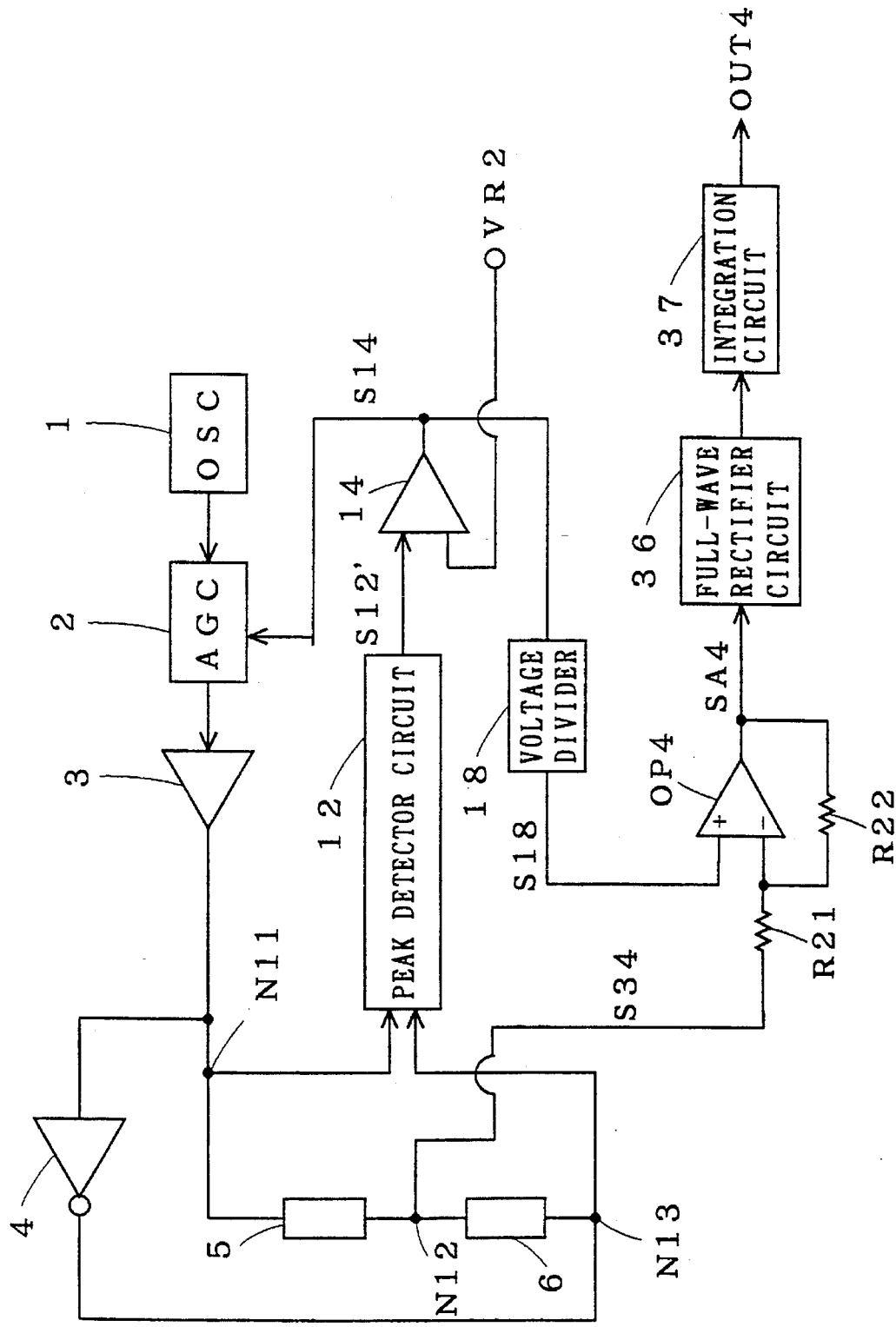
FIG. 20 is a block diagram of the sensor drive circuit according to a second feature of the eighth preferred embodiment of the present invention.
Figure 24:
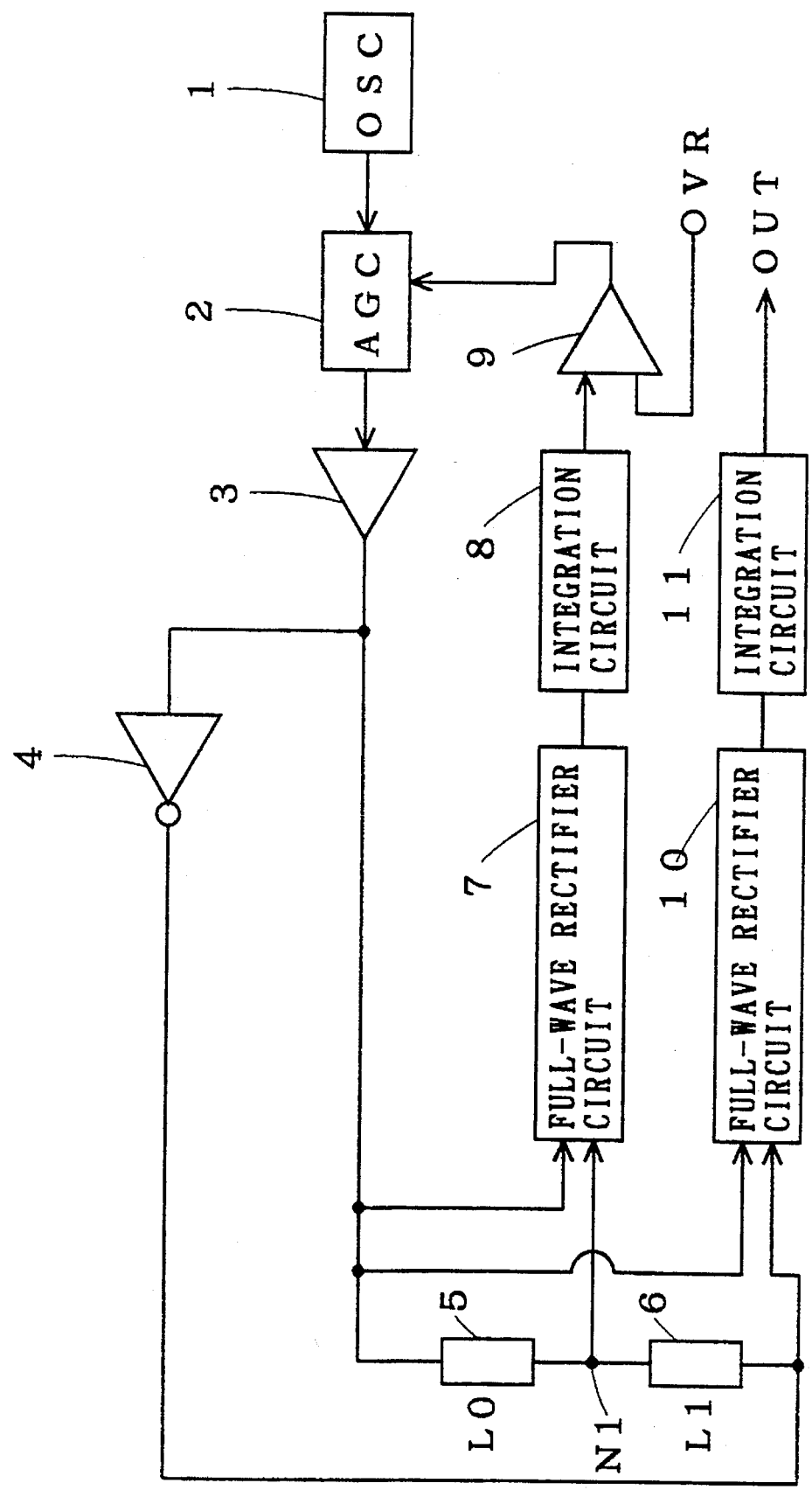
FIG. 24 is a block diagram of a conventional sensor drive circuit.
Figure 25:
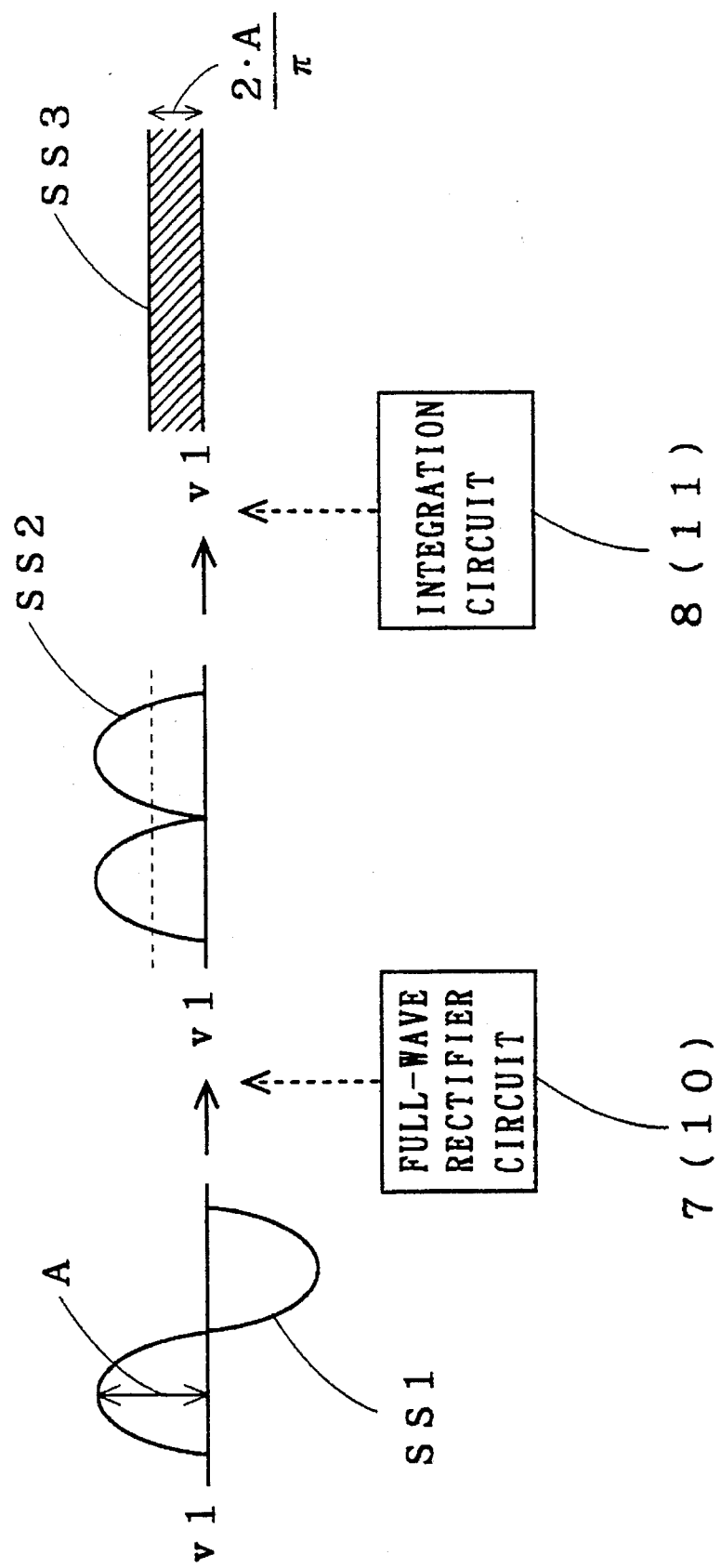
FIG. 25 illustrates the operation of the conventional sensor drive circuit.

With reference to FIG. 20, a full-wave rectifier circuit 36 and an integration circuit 37 may be substituted for the peak detector circuit 19. The operations of the full-wave rectifier circuit 36 and the integration circuit 37 are similar to those of the full-wave rectifier circuit 7 (10) and the integration circuit 8 (11) of the background art shown in FIG. 24, and the description thereof will be omitted herein.

The second to fifth preferred embodiments are modifications based on the sensor drive circuit of the first preferred embodiment, but may be applicable as modifications based on the sensor drive circuit of the eighth preferred embodiment.

Ninth Preferred Embodiment

Figure 21:
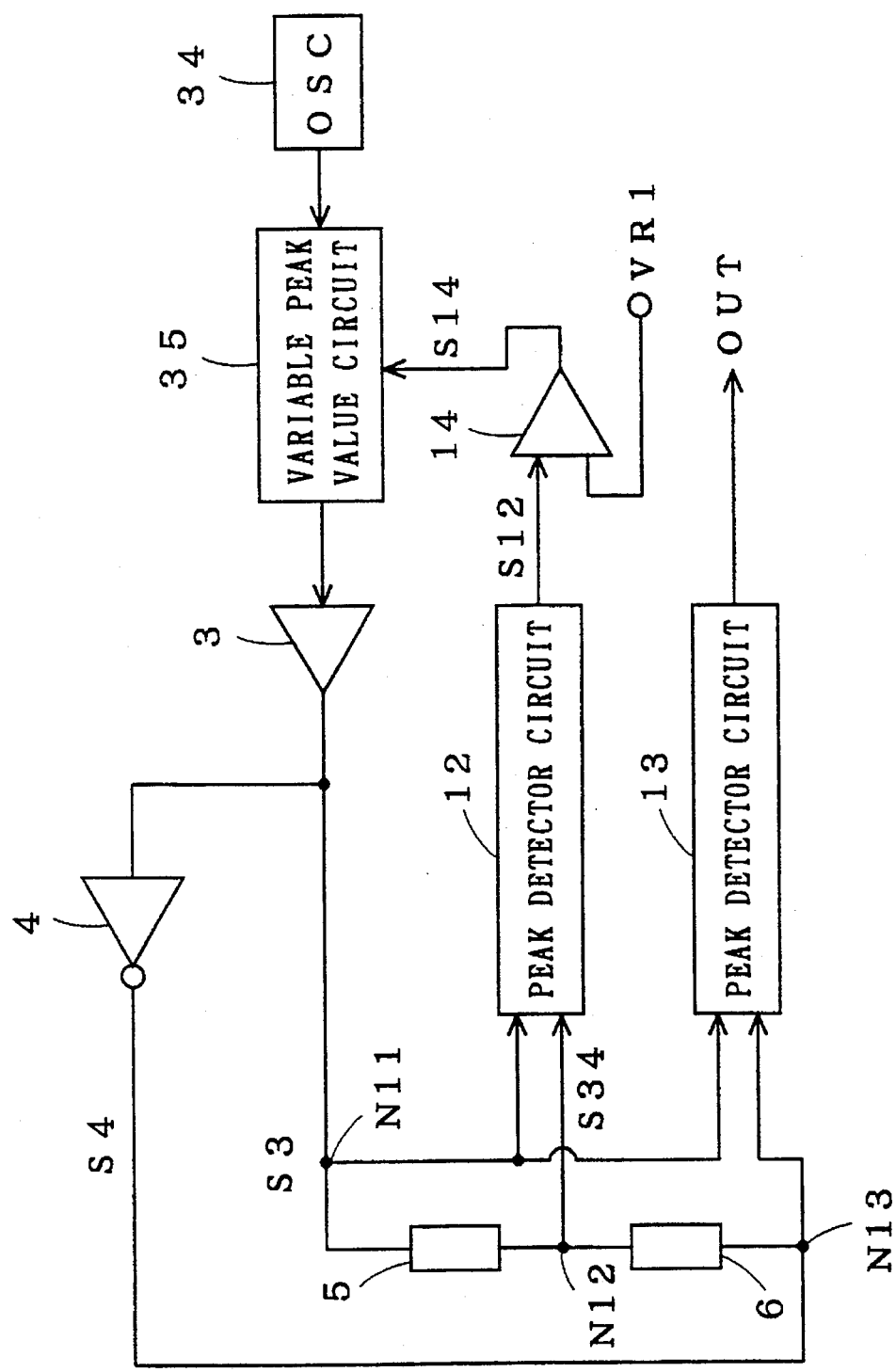
FIG. 21 is a block diagram of the sensor drive circuit according to a ninth preferred embodiment of the present invention.
Figure 22:
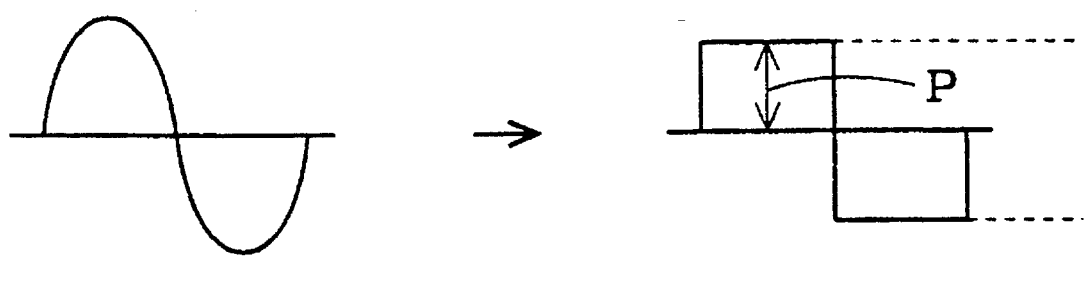
FIG. 22 illustrates the operation of the ninth preferred embodiment.
Figure 23:
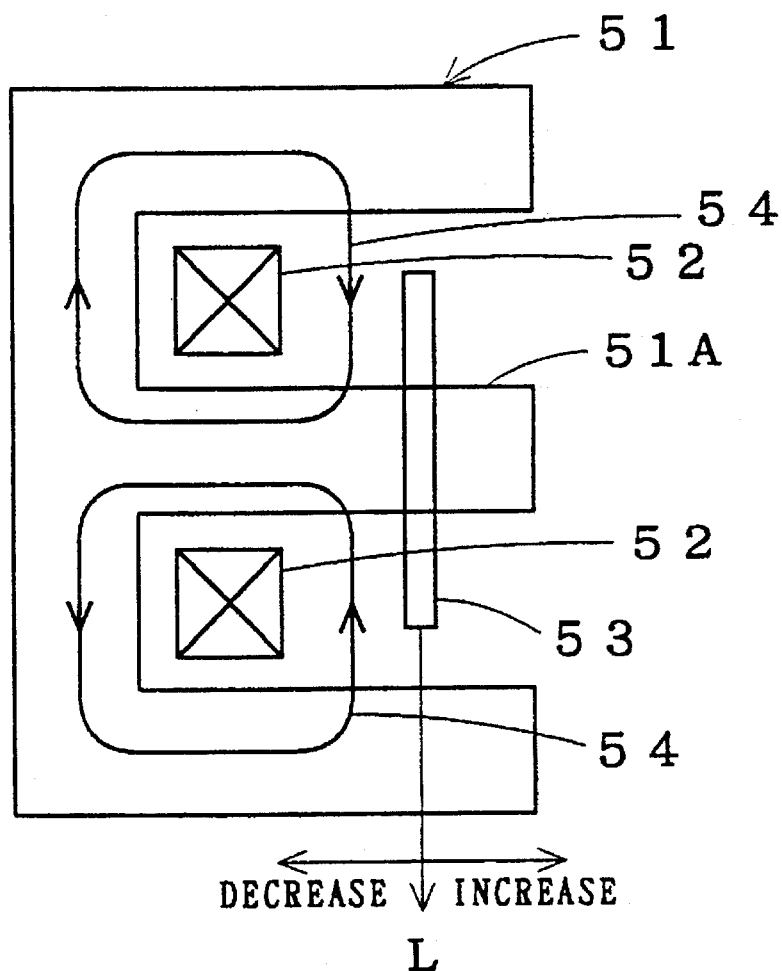
FIG. 23 illustrates the principle of a sensor employing a coil.

FIG. 21 is a block diagram of the sensor drive circuit according to a ninth preferred embodiment of the present invention. Referring to FIG. 21, an oscillator circuit 34 outputs a rectangular-wave oscillating signal illustrated on the right of FIG. 22 to a variable peak value circuit 35. The variable peak value circuit 35 performs automatic peak adjustment to provide a rectangular-wave signal having a determined peak value to the buffer 3 in response to the control signal S14 from the error amplifier 14. In FIG. 22, P represents the peak value of the rectangular wave. Other constructions of the ninth preferred embodiment are similar to those of the first preferred embodiment, and the description thereof will be omitted herein.

Such a construction provides operations and effects similar to those of the sensor drive circuit of the first preferred embodiment except that the waveform of the variable-amplitude signal S3, the intermediate signal S34 and the inverted variable-amplitude signal S4 is changed from the sine wave to the rectangular wave.

While the invention has been shown and described in detail, the foregoing description is in all aspects illustrative and not restrictive. It is therefore understood that numerous modifications and variations can be devised without departing from the scope of the invention.

What is claimed is:

1. A sensor drive circuit comprising:

a reference sensor having first and second ends and including a first coil of a fixed inductance;

a variable sensor including a second coil of a variable inductance, said second coil being connected in series with said first coil;

amplitude control means receiving a first signal from a side of the first end of said reference sensor and a second signal from a side of the second end thereof for controlling an amplitude of a difference signal between said first and second signals so as to be held constant; and inductance detection signal output means for outputting an inductance detection signal responsive to the amount of variation in the inductance of said second coil of said variable sensor, said amplitude control means including:

peak detecting means receiving said first and second signals for detecting a peak value of said difference signal to output a peak detection signal; and signal applying means receiving said peak detection signal for applying a signal to said first and second coils so that amplitudes of said first and second signals are varied in response to said peak detection signal.

2. The sensor drive circuit of claim 1, wherein said peak detecting means includes:

subtraction means for performing subtraction of said first and second signal to output said difference signal;

peak hold means for detecting the peak value of said difference signal and holding said value to output a peak signal; and sampling means for sampling said peak signal during a predetermined sampling time period to output said peak detection signal, said sensor drive circuit further comprising:

reset signal generating means receiving a reset time period control signal for varying an activation timing to output a reset signal in response to a cycle of said reset time period control signal; and reset executing means for setting the peak value of said difference signal held by said peak hold means to a predetermined initial level when said reset signal is active.

3. The sensor drive circuit of claim 1, wherein said peak detecting means detects a positive peak value and a negative peak value of said difference signal, and said peak detection signal is a difference between said positive peak value and said negative peak value.

4. The sensor drive circuit of claim 1, wherein the second end of said reference sensor is connected to a first end of said variable sensor;

said first signal is provided at the first end of said reference sensor;

said second signal is provided at a second end of said variable sensor; and said inductance detection signal output means includes second peak detecting means receiving a third signal provided at the first end of said variable sensor for detecting a peak value of a difference signal between said third signal and a ground level to output said peak value as said inductance detection signal.

5. The sensor drive circuit of claim 1, wherein the second end of said reference sensor is connected to a first end of said variable sensor, and said signal applying means includes:

amplitude control signal output means receiving said peak detection signal and a reference voltage for outputting an amplitude control signal on the basis of a result of comparison between said peak detection signal and said reference voltage;

variable amplitude means for determining an amplitude to output a variable-amplitude signal in response to said amplitude control signal; and signal providing means for providing said variable-amplitude signal to the first end of said reference coil and providing an inverted signal of said variable-amplitude signal to a second end of said variable coil.

6. The sensor drive circuit of claim 5, wherein said first signal is provided at the first end of said reference sensor;

said second signal is provided at the second end of said variable sensor; and said inductance detection signal output means includes:

voltage dividing means for dividing a voltage of said amplitude control signal to output a voltage-divided signal;

amplifying means receiving a third signal provided at the first end of said variable sensor and said voltage-divided signal for outputting an amplified signal of a difference between said voltage-divided signal and said third signal; and signal processing means for performing signal processing upon said amplified signal to output said inductance detection signal.

7. The sensor drive circuit of claim 6, wherein said signal processing means includes second peak detecting means for detecting a peak value of said amplified signal to output said peak value as said inductance detection signal.

8. The sensor drive circuit of claim 6, wherein said signal processing means includes:

full-wave rectifying means for full-wave rectifying said amplified signal to output a rectified signal; and integration means for integrating said rectified signal to output a resultant signal as said inductance detection signal.

9. The sensor drive circuit of claim 5, wherein said variable amplitude means includes variable peak value means for determining a peak value in response to said amplitude control signal to output a rectangular-wave signal of said peak value as said variable-amplitude signal.

10. The sensor drive circuit of claim 1, wherein said inductance detection signal output means includes second peak detecting means receiving a third signal provided at a first end of said variable sensor and a fourth signal provided at a second end thereof for detecting a peak value of a difference signal between said third and fourth signals to output said peak value as said inductance detection signal.

11. The sensor drive circuit of claim 10, wherein said peak detecting means includes:

subtraction means for performing subtraction of said first and second signals to output said difference signal;

peak hold means for detecting the peak value of said difference signal and holding said value to output a peak signal; and sampling means for sampling said peak signal during a predetermined sampling time period to output said peak detection signal.

12. The sensor drive circuit of claim 11, wherein said peak hold means includes:

a first operational amplifier having a positive input receiving said difference signal;

a diode having an anode connected to an output of said first operational amplifier;

a second operational amplifier having a positive input connected to a cathode of said diode, and an output fed back to a negative input of said second operational amplifier and a negative input of said first operational amplifier; and a capacitor having a first electrode connected to the positive input of said second operational amplifier, and a second electrode grounded, the output of said second operational amplifier being specified as said peak signal.

13. The sensor drive circuit of claim 12, wherein said peak hold means further includes switching means receiving an external reset signal for controlling connection/disconnection between the positive input of said second operational amplifier and a ground level in response to said reset signal.

14. The sensor drive circuit of claim 12, wherein said peak hold means further includes a resistor having a first end connected to the first electrode of said capacitor, and a second end grounded.

15. The sensor drive circuit of claim 12, wherein said peak hold means further includes:

a resistor having a first end connected to the first electrode of said capacitor; and switching means receiving an external reset signal for controlling connection/disconnection between a second end of said resistor and a ground level in response to said reset signal.

16. The sensor drive circuit of claim 10, wherein said peak detecting means includes:

subtraction means for performing subtraction of said first and second signals to output said difference signal;

A/D converting means for analog-to-digital converting said difference signal to output a digital difference signal;

digital peak value detecting means receiving said digital difference signal for detecting a peak value of said digital difference signal during a predetermined sampling time period to output a digital peak signal; and D/A converting means for digital-to-analog converting said digital peak signal to output said peak detection signal.

17. The sensor drive circuit of claim 10, wherein the second end of said reference sensor is connected to the first end of said variable sensor;

said first and third signals are provided at the first end of said reference sensor;

said second signal is provided at the second end of said reference sensor; and said fourth signal is provided at the second end of said variable sensor.

18. The sensor drive circuit of claim 10, wherein the second end of said reference sensor is connected to the first end of said variable sensor;

said first signal is provided at the first end of said reference sensor;

said second and fourth signals are provided at the second end of said variable sensor; and said third signal is provided at the first end of said variable sensor.

19. The sensor drive circuit of claim 10, wherein said peak detecting means includes:

subtraction means for performing subtraction of said first and second signals to output said difference signal;

peak hold means for detecting the peak value of said difference signal and holding said value to output a peak signal; and sampling means for sampling said peak signal during a predetermined sampling time period to output said peak detection signal, said sensor drive circuit further comprising:

reset signal generating means receiving a reset time period control signal for varying an activation timing to output a reset signal in response to a cycle of said reset time period control signal; and reset executing means for setting the peak value of said difference signal held by said peak hold means to a predetermined initial level when said reset signal is active.

20. The sensor drive circuit of claim 19, wherein said reset signal generating means includes:

a comparator having a first input receiving said reset time period control signal and a second input receiving a constant voltage for outputting a comparison result signal;

frequency dividing means for dividing a frequency of said comparison result signal to output a frequency-divided signal; and differentiation means for differentiating said frequency-divided signal to output said reset signal.

21. The sensor drive circuit of claim 10, wherein said peak detecting means detects a positive peak value and a negative peak value of said difference signal, and said peak detection signal is a difference between said positive peak value and said negative peak value.

22. The sensor drive circuit of claim 21, wherein said peak detecting means includes:

peak-to-peak hold means for detecting a peak-to-peak value and holding said value to output a peak-to-peak signal, said peak-to-peak value being a difference between a positive peak value of said first signal and a negative peak value of said second signal; and sampling means for sampling said peak-to-peak signal during a predetermined sampling time period to output said peak detection signal.

23. The sensor drive circuit of claim 22, wherein said peak-to-peak hold means includes:

a first diode having an anode receiving said first signal;

a first capacitor having a first electrode connected to a cathode of said first diode, and a second electrode receiving said second signal;

a second diode having a cathode connected to the anode of said first diode;

a second capacitor having a first electrode connected to the second electrode of said first capacitor, and a second electrode connected to an anode of said second diode: and subtraction means for performing subtraction of a first voltage provided at the first electrode of said first capacitor and a second voltage provided at the second electrode of said second capacitor to output said peak-to-peak signal.

24. The sensor drive circuit of claim 22, wherein said peak-to-peak hold means includes:

a first operational amplifier having a positive input receiving said first signal;

a first diode having an anode receiving an output of said first operational amplifier;

a first capacitor having a first electrode connected to a cathode of said first diode, and a second electrode grounded;

a second operational amplifier having a positive input connected to the cathode of said first diode, and an output ted back to a negative input of said second operational amplifier and a negative input of said first operational amplifier;

a third operational amplifier having a positive input receiving said second signal;

a second diode having a cathode connected to said third operational amplifier;

a second capacitor having a first electrode connected to an anode of said second diode, and a second electrode grounded;

a fourth operational amplifier having a positive input connected to the anode of said second diode, and an output fed back to a negative input of said fourth operational amplifier and a negative input of said third operational amplifier; and subtraction means for performing subtraction of a first voltage provided at the output of said second operational amplifier and a second voltage provided at the output of said fourth operational amplifier to output said peak-to-peak signal.

* * * * *